(12) United States Patent  
Clampitt

(10) Patent No.: US 6,686,235 B2  
(45) Date of Patent: Feb. 3, 2004

(54) BURIED DIGIT SPACER-SEPARATED CAPACITOR ARRAY

(75) Inventor: Darwin A. Clampitt, Homedale, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/832,918

(22) Filed: Apr. 12, 2001

(65) Prior Publication Data

US 2002/0151105 A1 Oct. 17, 2002

(51) Int. Cl.⁷ .......................................... H01L 21/8242
(52) U.S. Cl. ........................................ 438/239; 438/381
(58) Field of Search .................. 438/239, 240, 438/242, 243, 381, 383, 393, 396, 250, 253, 630, 637, 651, 664, 672, 675, 692, 755

(56) References Cited

U.S. PATENT DOCUMENTS

| | | | |
|---|---|---|---|
| 4,978,634 A | | 12/1990 | Shen et al. |
| 5,250,457 A | | 10/1993 | Dennison |
| 5,399,518 A | * | 3/1995 | Sim et al. .................. 438/396 |
| 5,418,180 A | | 5/1995 | Brown |
| 5,488,011 A | | 1/1996 | Figura et al. |
| 5,497,017 A | * | 3/1996 | Gonzales ................... 257/306 |
| 5,545,582 A | * | 8/1996 | Roh .......................... 438/381 |
| 5,563,089 A | | 10/1996 | Jost et al. |
| 5,604,146 A | * | 2/1997 | Tseng ......................... 438/239 |
| 5,728,617 A | | 3/1998 | Tseng |
| 5,770,499 A | | 6/1998 | Kwok et al. |
| 5,789,289 A | | 8/1998 | Jeng |
| 5,902,126 A | | 5/1999 | Hong et al. |
| 5,926,363 A | | 7/1999 | Kuriyama |
| 5,926,710 A | * | 7/1999 | Tseng ......................... 438/396 |
| 5,976,977 A | | 11/1999 | Hong |
| 5,998,256 A | * | 12/1999 | Juengling ................... 438/253 |
| 6,008,513 A | | 12/1999 | Chen |
| 6,030,867 A | | 2/2000 | Chien et al. |
| 6,087,263 A | | 7/2000 | Clampitt et al. |
| 6,159,839 A | | 12/2000 | Jeng et al. |
| 6,391,735 B1 | | 5/2002 | Durcan et al. |
| 6,395,600 B1 | * | 5/2002 | Durcan et al. ............. 438/253 |
| 6,417,537 B1 | | 7/2002 | Yang et al. |
| 6,426,243 B1 | | 7/2002 | Coursey |

* cited by examiner

Primary Examiner—David Nhu
(74) Attorney, Agent, or Firm—Dickstein Shapiro Morin & Oshinsky LLP

(57) ABSTRACT

The present invention relates to the field of semiconductor integrated circuits and, in particular, to capacitor arrays formed over the bit line of an integrated circuit substrate. The present invention provides a method for forming stacked capacitors, in which a plurality of patterned capacitor outlines, or walls, are formed over the bit line of a semiconductor device. In one aspect of the invention, spacers are formed on the patterned capacitor outlines and become part of the cell poly after being covered with cell nitride. In another aspect, the spacers are formed of a material capable of being etched back, such as titanium nitride. In another aspect, a metal layer is patterned and annealed to a polysilicon layer to form a mask for a capacitor array, and subsequently etched to form the array.

59 Claims, 22 Drawing Sheets

BURIED DIGIT SPACER-SEPARATED CAPACITOR ARRAY

FIELD OF THE INVENTION

The present invention relates to the field of semiconductor integrated circuits and, in particular, to capacitor arrays formed over the bit line of an integrated circuit substrate.

BACKGROUND OF THE INVENTION

The current semiconductor industry has an ever-increasing pressure for achieving higher device density within a given die area. This is particularly true in memory circuit fabrication, for example Dynamic Random Access Memory (DRAM) manufacturing. A memory cell of a typical DRAM includes a storage capacitor and a charge transfer field effect transistor. The binary data is stored as electrical charge on the storage capacitor in the individual memory cell.

In the early days of DRAM development, planar-type storage capacitors were used which occupied large substrate areas. These were later replaced with container capacitors which occupied less surface area. Recently, however, with the number of memory cells on the DRAM chip dramatically increasing, the miniaturization of DRAM devices requires smaller capacitor features as well as increased storage capacitance.

Different approaches have been employed to achieve higher storage capacitance on a given die area to meet the demands of increasing packing density. For example, with trench capacitors, electrical charge has been stored in capacitors formed vertically in a trench that requires a deep trench formation, but this encounters significant processing difficulties. Another approach is to build a stacked container storage capacitor over at least a portion of the transistor to allow, therefore, smaller cells to be built without losing storage capacity. Stacked capacitors have become increasingly accepted in the semiconductor art. However, as the device density continues to increase, the planar surface area required for building the conventional stacked capacitors must be further reduced. Further, the topography of currently fabricated devices requires more difficult planarization processes to be performed on the DRAM devices.

Accordingly, there is a need for an improved method for fabricating stacked capacitors that minimizes the drawbacks of the prior art. There is also a need for stacked capacitors which have minimal spacing that is not afforded by current photolithographic feature sizes.

SUMMARY OF THE INVENTION

The present invention provides a method for forming stacked capacitors in high density, in which a plurality of patterned capacitor outlines in the form of walls, are formed over the bit line of a semiconductor device. In one aspect of the invention, spacers are formed on the patterned capacitor walls and become part of the cell polysilicon after being covered with cell nitride. In another aspect, the spacers are formed of a material capable of being etched back, such as titanium nitride. In another aspect, a metal layer is patterned and annealed to a polysilicon layer to form a mask for a capacitor array, and subsequently etched to form the array.

Additional features and advantages of the present invention will be more clearly apparent from the detailed description which is provided in connection with accompanying drawings which illustrate exemplary embodiments of the invention.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has a semiconductor surface. The term should be understood to include silicon, silicon-on-insulator (SOI), silicon-on-sapphire (SOS), silicon-on-nothing (SON), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a "substrate" in the following description, previous process steps may have been utilized to form regions or junctions in or on the base semiconductor or foundation.

Figure 1:
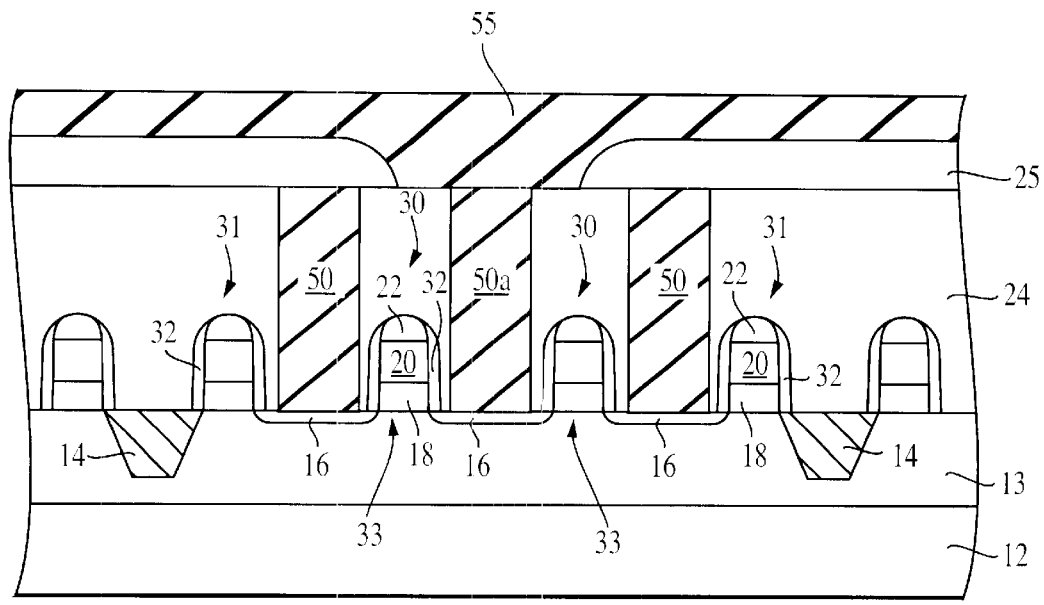
FIG. 1 is a diagrammatic sectional view of a semiconductor wafer fragment illustrating a base structure for forming the first embodiment of the invention.

Referring now to the drawings, where like elements are designated by like reference numerals, FIG. 1 depicts a portion of a memory cell construction for a DRAM at an intermediate stage of the fabrication, in which stacked capacitors are to be formed in accordance with the present invention. A pair of memory cell access transistors 33 are formed within and over a doped well 13 of a substrate 12. The well may be a p-well or n-well depending on the type of transistor 33. The pair of transistors 33 are surrounded by a trench isolation region 14 that provides isolation. N-type active regions 16 are provided in the doped p-type well 13 of substrate 12 (for NMOS transistors) and the pair of access transistors have respective gate stacks 30. The gate stacks 30 include an oxide layer 18, a conductive layer 20, such as a doped polysilicon layer with tungsten silicide on it, nitride sidewall spacers 32, and a nitride cap 22. Additional stacks 31 may also be formed for use in performing self aligned contact etches to form conductive plugs 50, 50a for capacitor structures in the region between stacks 30, 31. The details of these steps are well-known in the art and are not described in detail herein.

Polysilicon plugs 50, 50a (FIG. 1) are formed in a contact opening of a first insulating layer 24, to directly connect to a source or drain region 16 of the semiconductor device. The first insulating layer 24 could be, for example, borophosphosilicate glass (BPSG), borosilicate glass (BSG), or phosphosilicate glass (PSG). Once the polysilicon plugs 50, 50a are formed, the whole structure, including the substrate 12 with the gate stacks 30, the first insulating layer 24 and the polysilicon plugs 50, 50a is CMP polished to provide a planarized surface.

At this point, a second insulating layer 25, which can be of the same material as that of the first insulating layer 24, is deposited over the first insulating layer 24 and the polysilicon plugs 50, 50a. A contact opening or via is etched over the polysilicon plug 50a and a conductive layer or interconnection layer 55 is then deposited and patterned to connect to polysilicon plug 50a, as illustrated in FIG. 1. The inter-connection layer 55 functions as a digit line. The digit line is made of, for example, a polysilicon, titanium nitride, or a tungsten material with a nitride cap.

Figure 2:
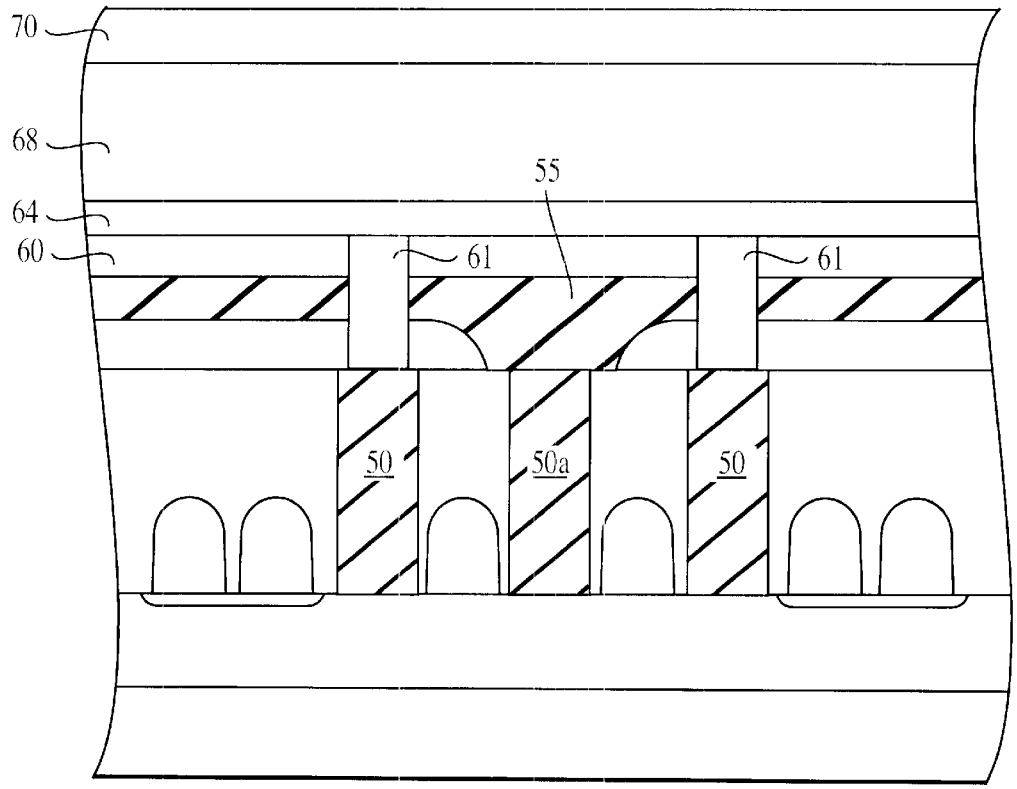
FIG. 2 is a side sectional view of the FIG. 1 semiconductor wafer fragment after initial processing steps for forming the first embodiment of the invention.

Referring now to FIG. 2, a third insulative layer 60 is formed over the inter-connection layer 55. The third insulative layer 60 could be, for example, BPSG, BSG, or PSG. The polysilicon plugs 50, that are not in contact with the digit line 55, are made to extend through the third insulative layer 60. The contact holes for the polysilicon plugs in layer 60 are made using conventional photolithographic techniques and plasma etching. For example, the etching can be carried out in a reactive ion etcher (RIE) using an etchant gas mixture containing fluorine, such as $C_5F_8$, $C_4F_8$, $CHF_3$, $CO$, $O_2$, and $Ar$.

A layer of conductively doped polysilicon is deposited over layer 60 to fill the contact holes and provide conductive plugs 61, and subsequently etched back to expose layer 60. The conductive plugs 61 are electrically isolated from the digit line 55, for example, by nitride spacers (not shown). The details of these steps are well-known in the art and other methods may be used.

Next, an etch stop layer 64 is deposited over the third insulative layer 60. The etch stop layer 64 could be, for example, a nitride, or another dielectric etch stop layer. A thick layer 68 of BPSG, or other insulative material, is then deposited over the etch stop layer 64. The layer 68 of BPSG is etchably different from the etch stop layer 64. On top of layer 68, a layer 70 of polysilicon is deposited. Layers 68 and 70 are also substantially etchably different.

Figure 3:
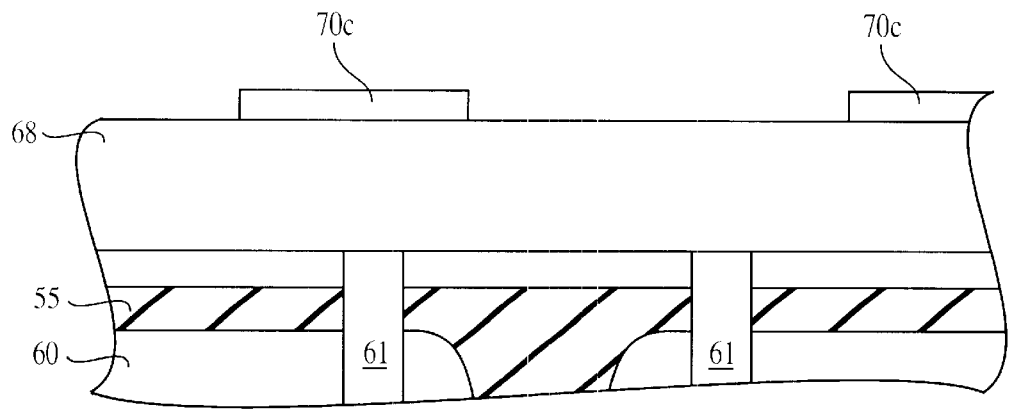
FIG. 3 is a side sectional view of the FIG. 2 structure at a subsequent stage of fabrication.
Figure 4:
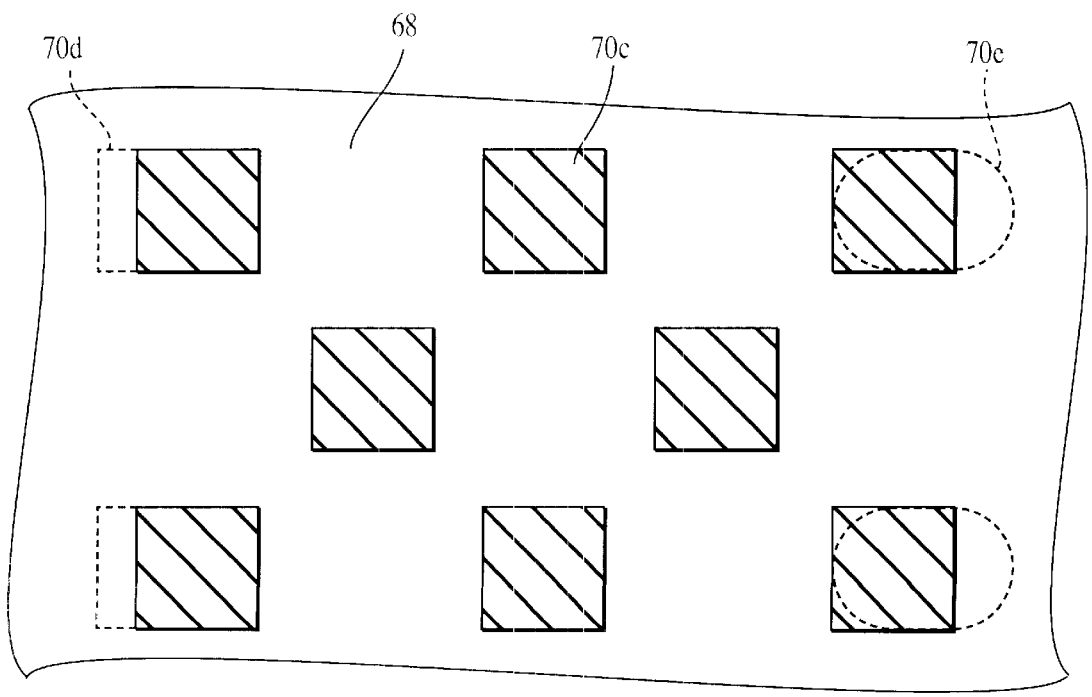
FIG. 4 is a top view of FIG. 3.

One patterning option for forming capacitors of the present invention is to create alternating polysilicon rectangles in the polysilicon layer 70. This can be accomplished, for example, by patterning with resist and etching the polysilicon layer 70 to form a square or rectangular checker board pattern. This etching step etches through the polysilicon layer 70 but stops at the BPSG layer 68. The result of this etching step is a checker board pattern of square polysilicon blocks 70c, as illustrated in FIGS. 3 and 4. Alternatively, the patterning can be used to create an alternating pattern of rectangular shaped blocks, or oval shaped blocks, illustrated by dashed lines 70d and 70e, respectively, in FIG. 4.

Figure 5:
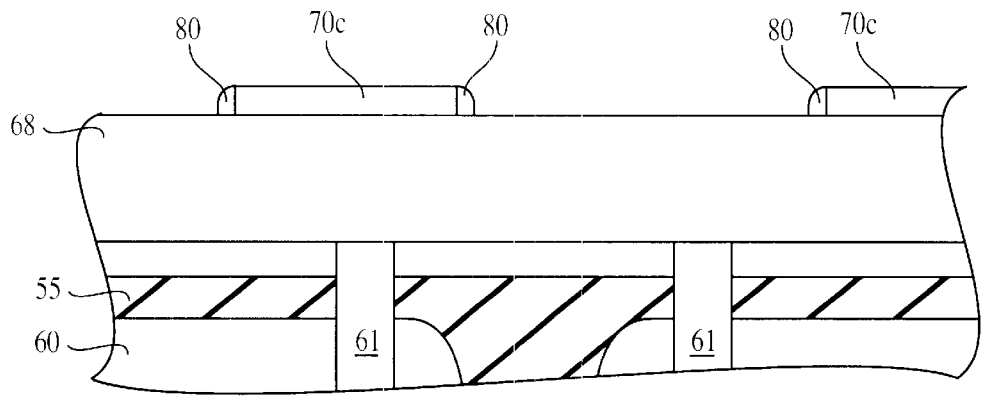
FIG. 5 is a side sectional view of the FIG. 3 structure at a subsequent stage of fabrication.
Figure 6:
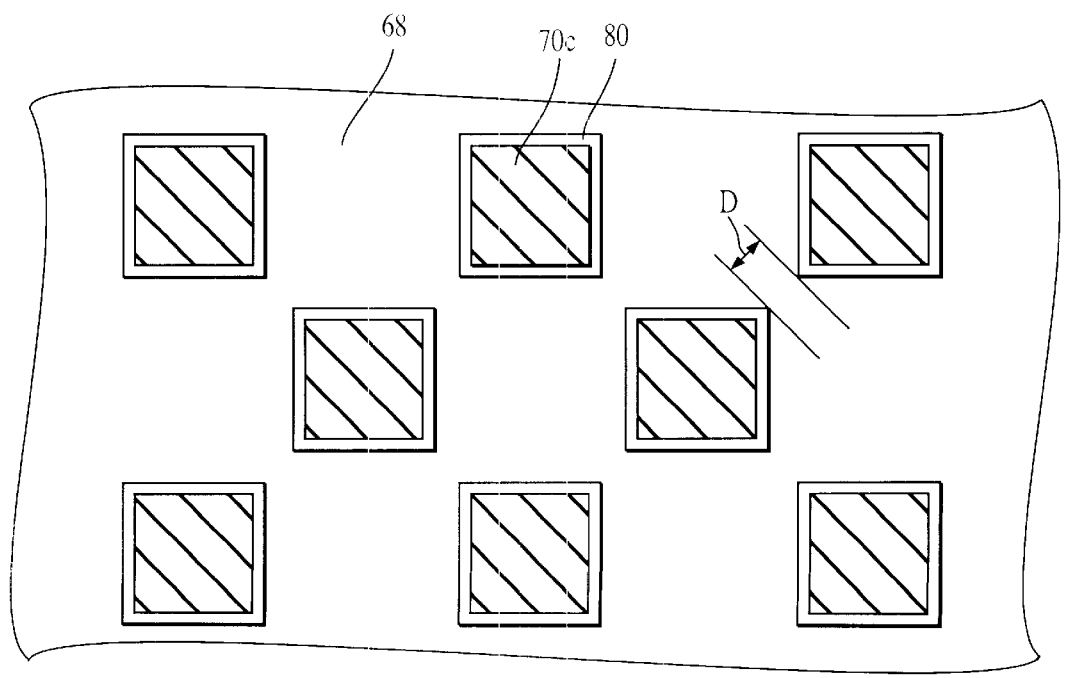
FIG. 6 is a top view of FIG. 5.

Next, sidewall spacers 80 are formed on the sidewalls of alternating square, rectangular, or oval blocks 70c, 70d and 70e, as shown in FIGS. 5 and 6. The spacers 80 are formed by depositing a polysilicon layer over the polysilicon blocks 70c, 70d, or 70e (hereinafter collectively referred to as "blocks 70c"), and subsequently anisotropically etching to provide a plurality of sidewall spacers 80 on all vertical surfaces of alternating blocks 70c. Collectively, the sidewall spacers 80 and polysilicon blocks 70c define an array of structure profiles which will be transferred into at least one of the underlying layers.

In another patterning option, the square, rectangular, or oval checker board pattern of FIGS. 5 and 6 can be printed with photoresist onto the BPSG layer 68. Blocks 70c and spacers 80 would be comprised of photoresist. With this option, the minimum corner to corner spacing between the photoresist square or rectangular blocks would have to be maintained without bridging.

Figure 7:
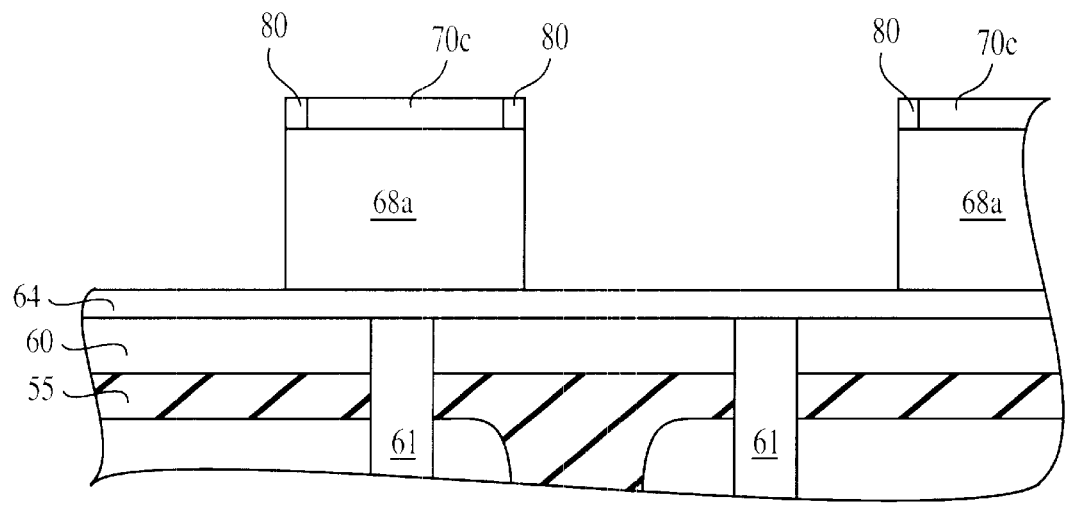
FIG. 7 is side sectional view of the FIG. 5 structure at a subsequent stage of fabrication.

Next, with reference to FIG. 7, the BPSG layer 68 is selectively and anisotropically etched down to the nitride etch stop layer 64 to form BPSG blocks 68a. Care should be taken during this step to overetch enough to clear the BPSG material out from between the corners of the blocks to prevent possible cell node to cell node shorts. The polysilicon spacers 80 and remaining polysilicon blocks 70c (or 80 and 70c comprised of photoresist) are then selectively removed by suitable methods such as chemical-mechanical polish (CMP), or wet or dry etching, which are well known in the art.

Figure 8:
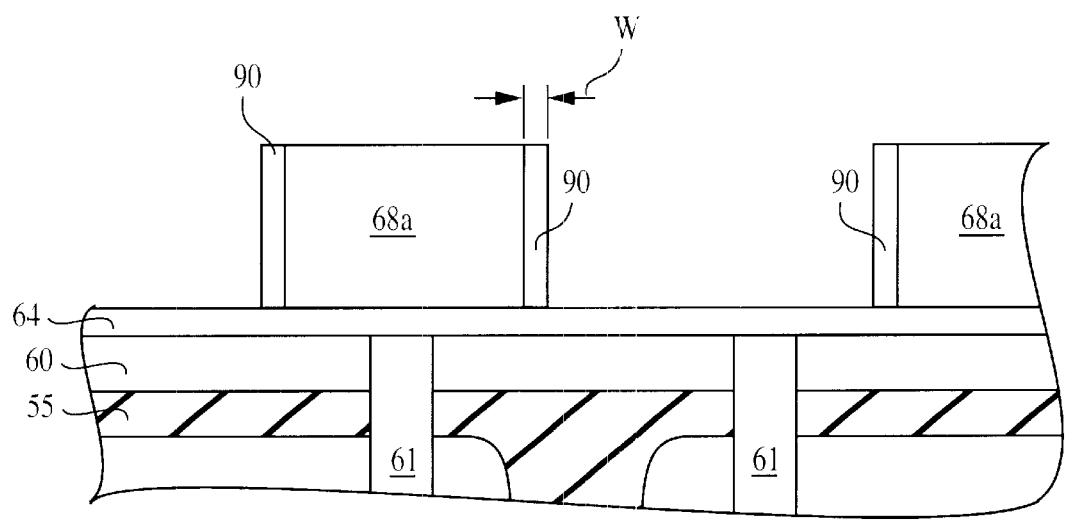
FIG. 8 is a side sectional view of the FIG. 7 structure at a subsequent stage of fabrication.
Figure 9:
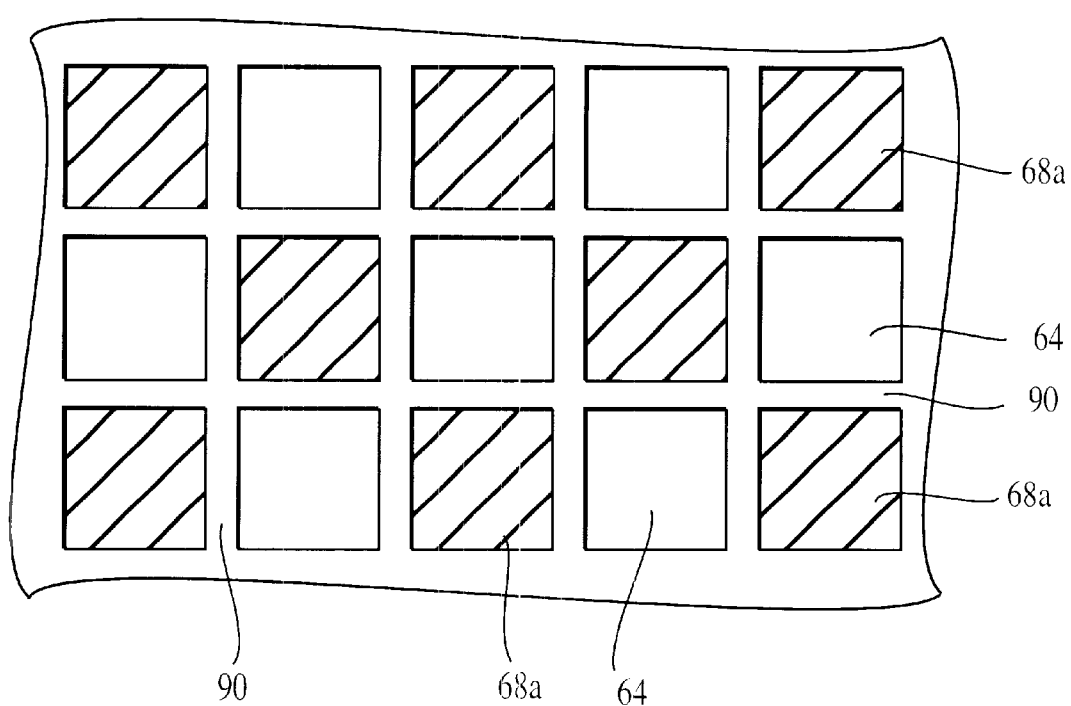
FIG. 9 is a top view of FIG. 8.

Referring now to FIGS. 8 and 9, a spacer 90 is deposited on the vertical walls of the BPSG blocks 68a. The spacer 90 must be wide enough to bridge together at the corners of BPSG blocks 68 to isolate individual squares, rectangles, or ovals in order to prevent the possibility of cell node to cell node shorts. The width W of spacer 90 should be greater than distance ½ D of FIG. 6. The spacer 90 material is preferably either titanium nitride, polysilicon, or another material etchably different from the BPSG blocks 68a. The spacer 90 material may also comprise platinum. Alternatively, the material for blocks 68a (material layer 68) can comprise any material that is etchably different from the spacer material 90. The material 68 can be chosen to be a material that may remain on the periphery of the integrated circuit without the need to remove it during subsequent process steps.

Figure 10:
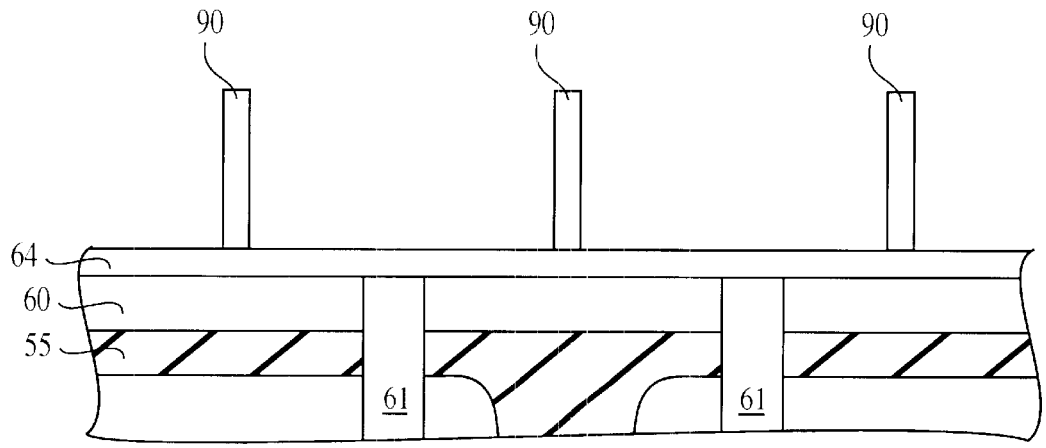
FIG. 10 is a side sectional view of the FIG. 8 structure at a subsequent stage of fabrication.
Figure 11:
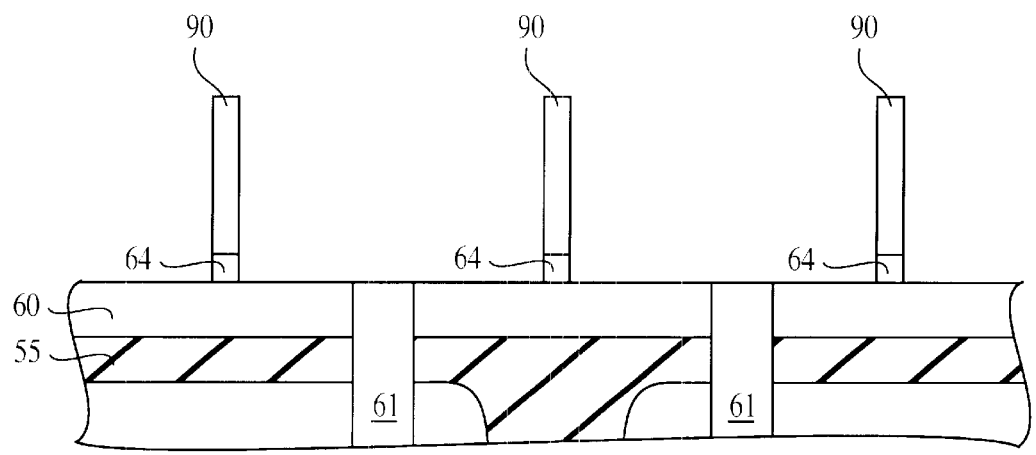
FIG. 11 is a side sectional view of the FIG. 10 structure at a subsequent stage of fabrication.

The BPSG blocks 68a are then selectively etched away down to the nitride etch stop layer 64, shown in FIG. 10, preferably using a wet etch leaving the spacers 90 intact. The periphery is covered with resist during this step to prevent removal of BPSG from other areas. At this point the spacers 90 are in the form of a square, rectangular, or oval honeycomb pattern. Thereafter, as shown in FIG. 11, the etch stop layer 64 is selectively etched or otherwise removed using spacers 90 as a pattern utilizing techniques well known in the art.

Figure 12:
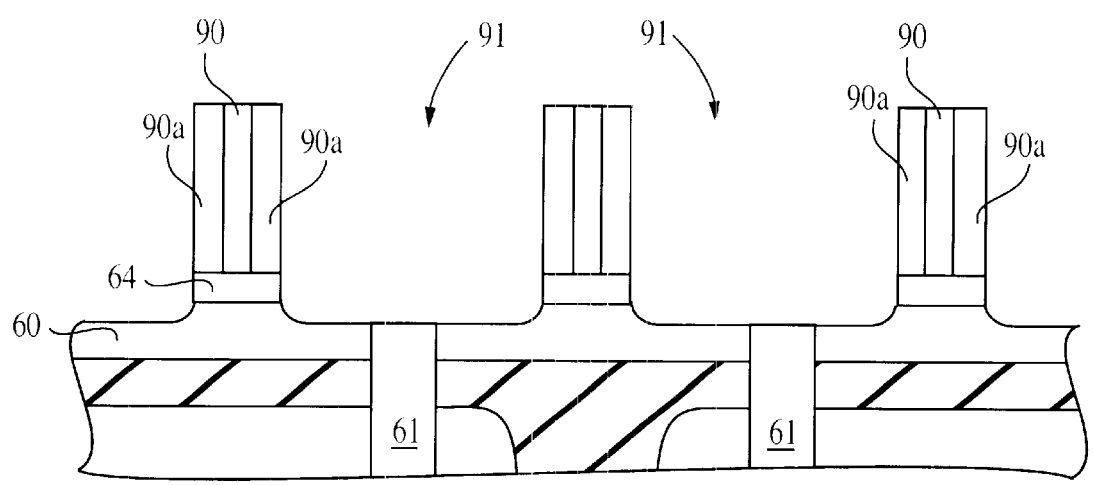
FIG. 12 is a side sectional view of the FIG. 11 structure at a subsequent stage of fabrication.

If the spacer material used for spacers 90 is titanium nitride and it is desirable to increase its thickness, another layer of titanium nitride 90a is deposited over existing spacers 90 and spacer etched, as seen in FIG. 12. Alternatively, titanium nitride can be deposited in one step in a layer of sufficient thickness approximately equal to layer 90 and the two layers 90a. During this etching process the portions of newly deposited titanium nitride spacer 90a covering the insulative layer 60 are overetched so as to expose a direct electrical contact with polysilicon plugs 61.

Figure 13:
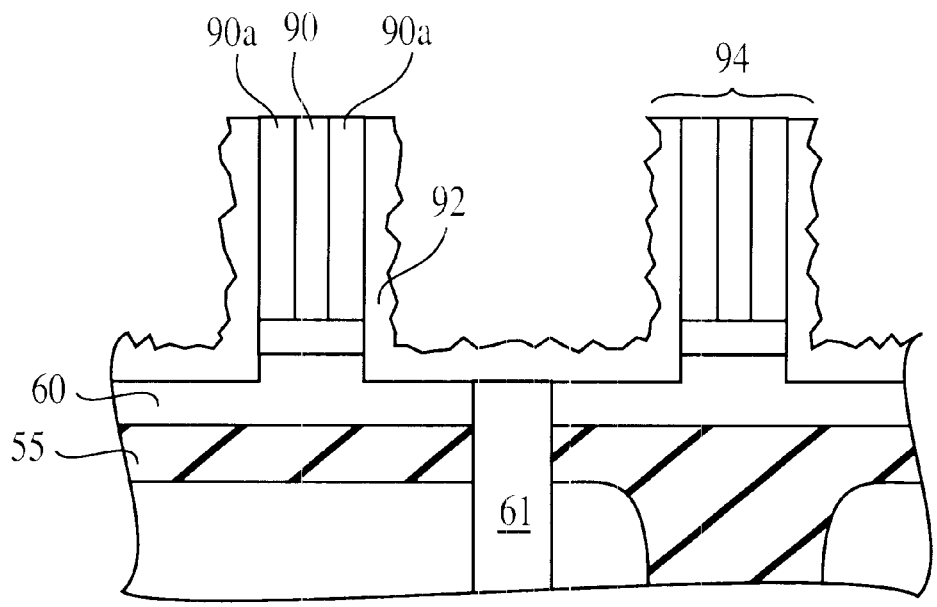
FIG. 13 is a side sectional view of the FIG. 12 structure at a subsequent stage of fabrication.
Figure 14:
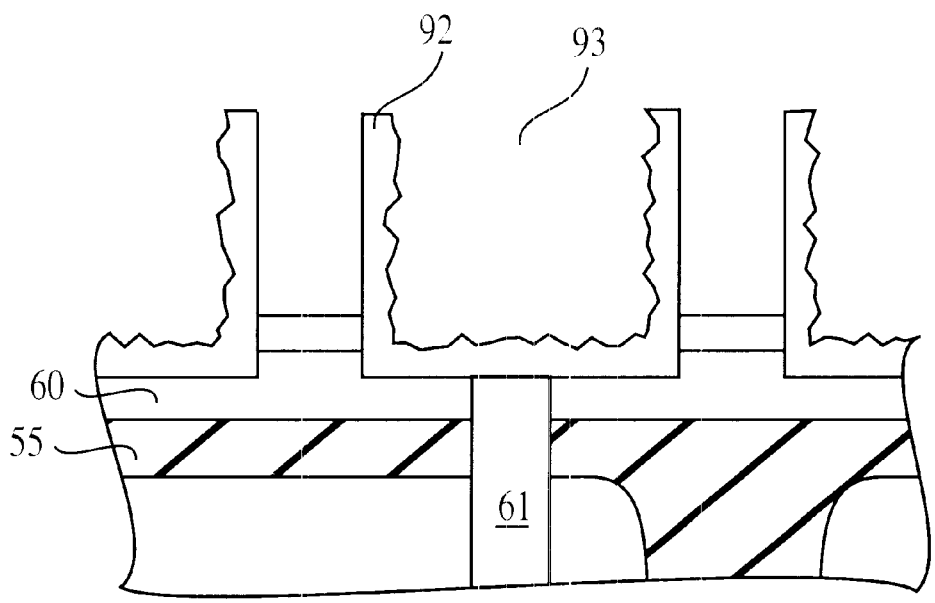
FIG. 14 is a side sectional view of the FIG. 13 structure at a subsequent stage of fabrication.

Next, with reference to FIG. 13, a hemispherical grain (HSG) polysilicon 92 is deposited over the spacers 90 and 90a, and exposed polysilicon plugs 61. This rough polysilicon layer 92 forms the cell node of a capacitor. The rough HSG layer 92 increases the surface area of the storage node which improves the cell's capacitance. The upper portion of the HSG layer 92 is then removed by chemical-mechanical polish (CMP) or dry etching, as well known in the art, to isolate cell nodes and expose the top portion of the titanium nitride layers, designated by reference numeral 94. The titanium nitride 90, 90a is then selectively removed by etching with a piranha (sulfuric/hydrogen peroxide) process, or other selective etch process, to isolate the containers 93 formed by the remaining HSG layer, as shown in FIG. 14. Then, as well known in the art, a cell nitride dielectric and a capacitor upper electrode may be deposited to form capacitors in the containers 93. For example, as noted, Hemispherical Grain (HSG) Polysilicon 92 can be deposited to form the bottom cell plate of the capacitor, followed by deposition of a dielectric layer such as a nitride, followed by deposition of an upper electrode.

Figure 15:
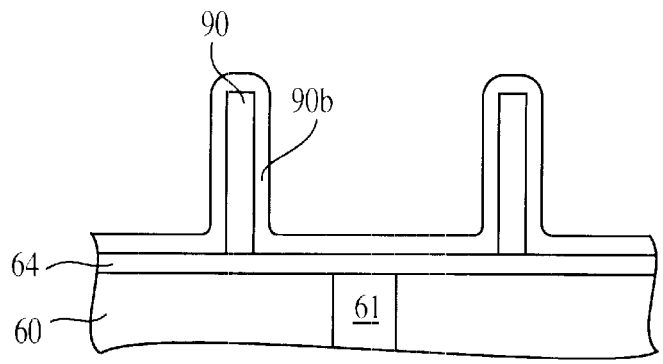
FIG. 15 is a side sectional view of the FIG. 11 structure at a subsequent stage of fabrication.
Figure 16:
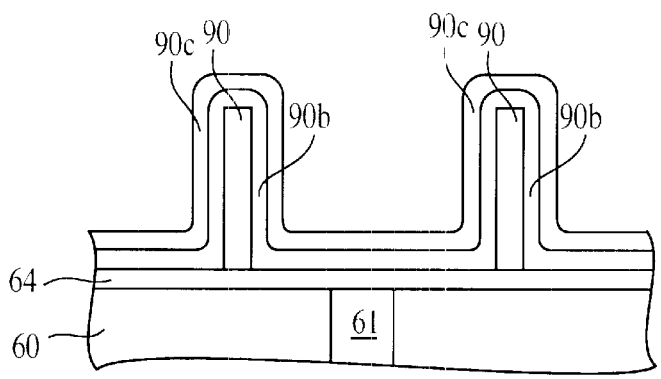
FIG. 16 is a side sectional view of the FIG. 15 structure at a subsequent stage of fabrication.
Figure 17:
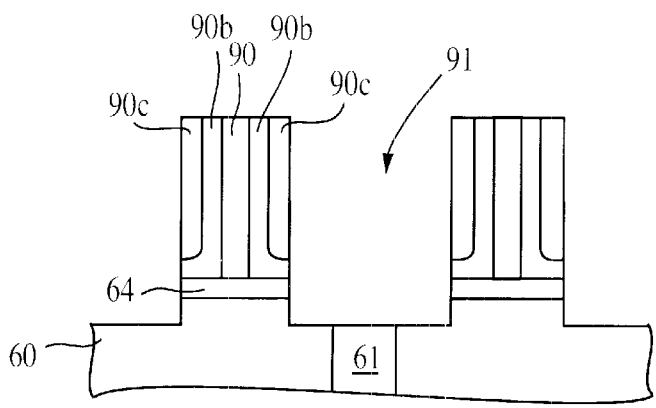
FIG. 17 is a side sectional view of the FIG. 16 structure at a subsequent stage of fabrication.

Referring back to FIG. 8, if the spacer material used for spacers 90 is polysilicon, then a thin layer of silicon nitride 90b is deposited over the polysilicon spacers 90, as shown in FIG. 15. Then, referring to FIG. 16, a layer of polysilicon 90c is deposited over the silicon nitride layer 90b. The polysilicon layer 90c is anisotropically etched along with the layer of silicon nitride 90b, etch stop layer 64, and an upper portion of insulating layer 60 to define containers 91, as shown in FIG. 17. During this etching process the portions of newly deposited polysilicon layer 90c covering the etch stop layer 64 are overetched so as to expose a direct electrical contact with polysilicon plugs 61.

Figure 18:
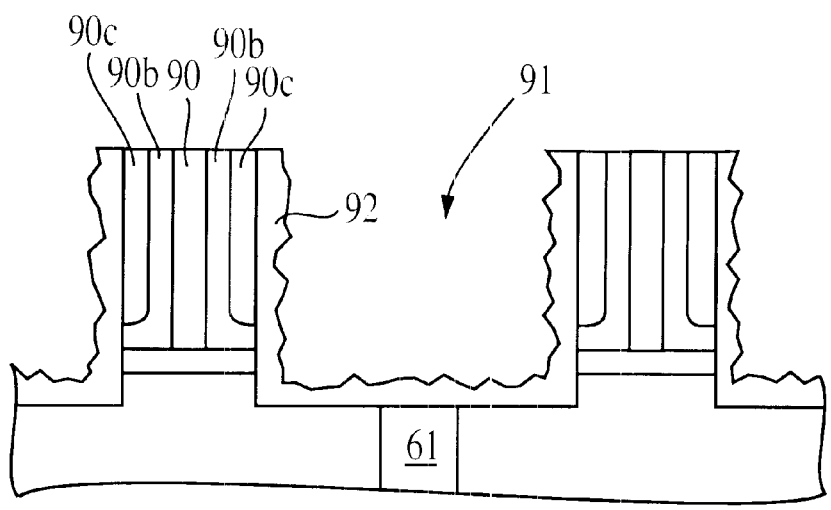
FIG. 18 is a side sectional view of the FIG. 17 structure at a subsequent stage of fabrication.

Hemispherical grain (HSG) polysilicon 92 is then deposited over the spacers 90, 90b, and 90c, and exposed polysilicon plugs 61. The containers 91 are then filled with photoresist and the HSG layer 92 is removed by chemical-mechanical polish (CMP) or dry etching to expose the horizontal surfaces of layers 90, 90b, and 90c, as shown in FIG. 18. Then, as well known in the art, cell nitride and an upper capacitor electrode may be deposited to form capacitors in the containers 91, as discussed above. During subsequent processing steps, electrical connections may be established between an upper capacitor electrode and polysilicon spacer 90, to enable the spacer to become part of the cell plate of the capacitor.

Figure 19:
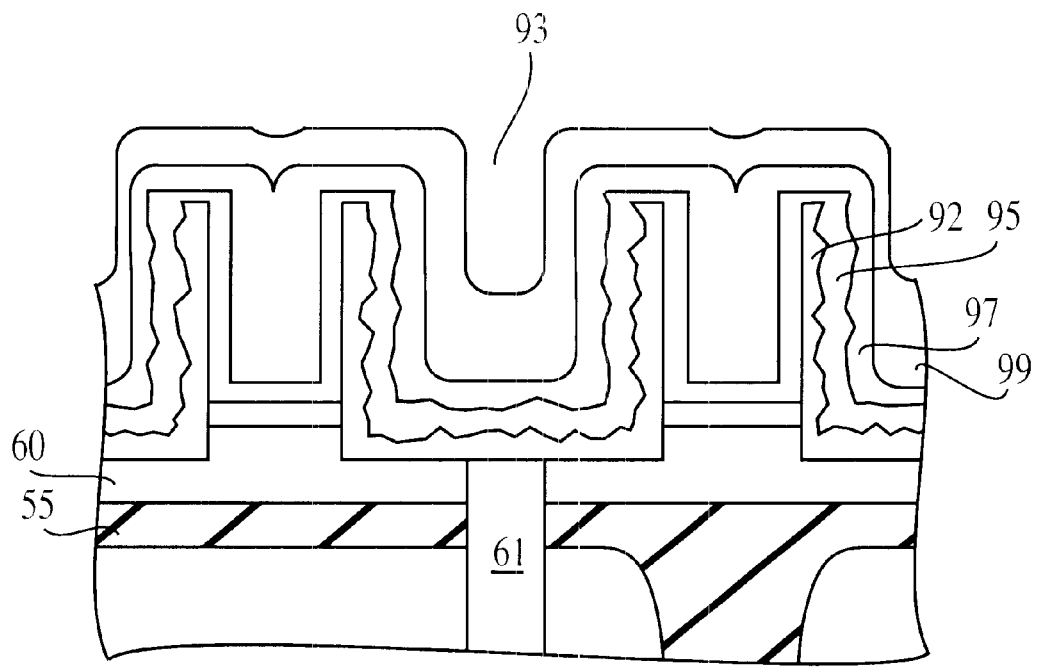
FIG. 19 is a side sectional view of the FIG. 14 structure at a subsequent stage of fabrication.

Another way to form capacitors, utilizing the disclosed patterning techniques, is by utilizing the above disclosed structures of FIGS. 14 and 18 with barriers, metal electrodes, and cell plates with dielectrics having high dielectric constants. For example, with reference to FIG. 19, a metal insulator silicon (MIS) capacitor can be formed as follows. An ammonia anneal is performed on the wafer to nitridize the surface of the HSG polysilicon 92. Thereafter, if the sidewall spacers 90 (FIGS. 10–14) are titanium nitride spacers, ans were removed prior to amonia anneal a cell dielectric layer 95, such as tantalum pentoxide ($Ta_2O_5$), is deposited over the polysilicon surface 92. A cell plate of titanium nitride 97 is deposited over the dielectric layer 95. A layer of polysilicon 99 is then deposited over layer 97 to prevent oxidation of the titanium nitride layer 97 during subsequent steps such as deposition of BPSG. In the above example, if the sidewall spacers 90 are polysilicon spacers (FIGS. 10, 15–18), then $Ta_2O_5$ is substituted for silicon nitride in layer 90b of FIG. 18.

Figure 20:
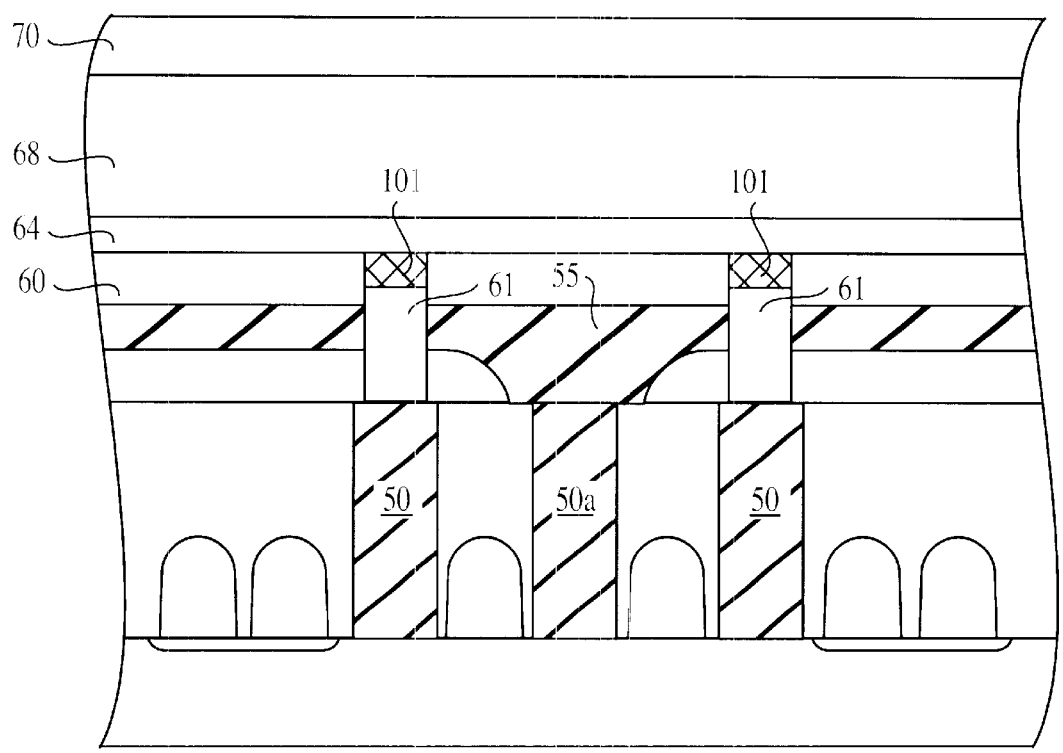
FIG. 20 is a diagrammatic sectional view of a semiconductor wafer fragment illustrating a base structure for forming another embodiment of the invention.

Another way of forming capacitors in the present invention is by forming metal insulator metal (MIM) capacitor structures. With reference to FIG. 20, after conductively doped polysilicon is deposited over layer 60 to fill the contact holes and provide conductive plugs 61, the polysilicon is overetched so that the plugs 61 are recessed below the surface of the layer 60. A layer of conductive barrier material 101, such as tantalum nitride or tantalum silicon nitride, is deposited over the layer 60 and subsequently removed by etching or CMP to expose the layer 60 and the conductive barrier layer 101 on top of the plugs 61. Thereafter, layers 64, 68, and 70 are deposited and patterned as discussed above.

Figure 21:
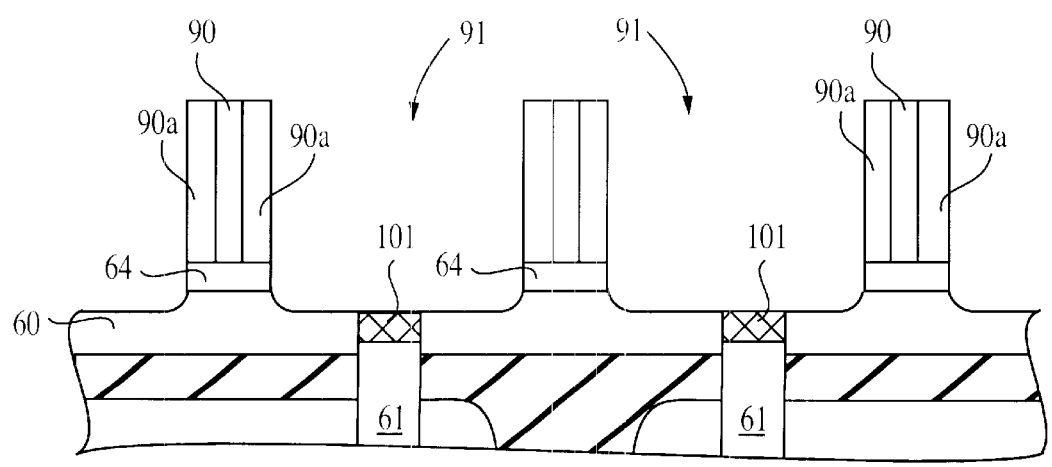
FIG. 21 is a side sectional view of the FIG. 20 structure at a subsequent stage of fabrication.
Figure 22:
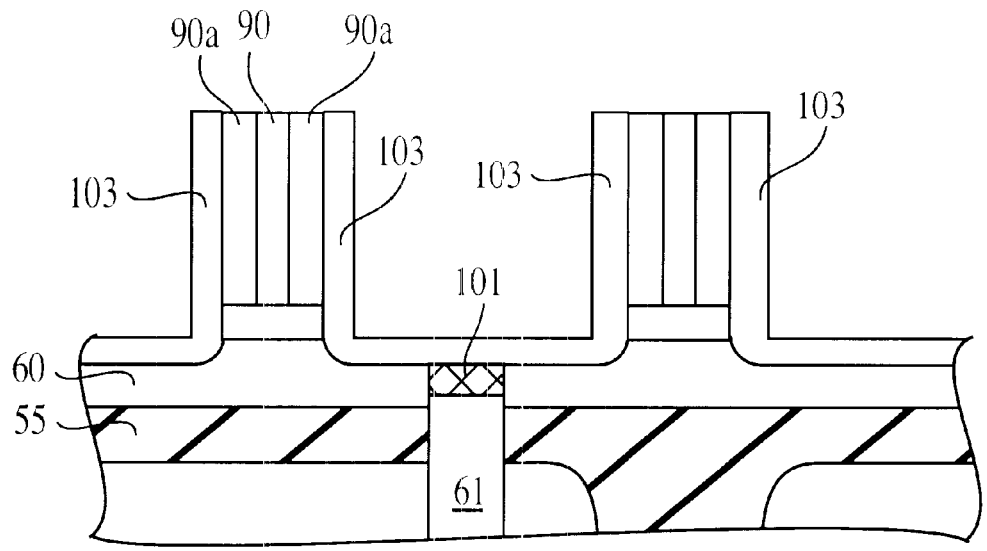
FIG. 22 is a side sectional view of the FIG. 21 structure at a subsequent stage of fabrication.
Figure 23:
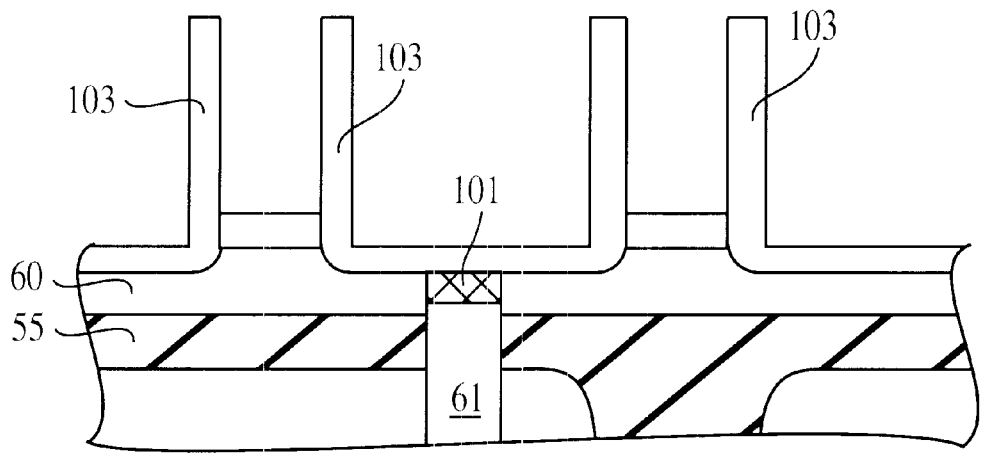
FIG. 23 is a side sectional view of the FIG. 22 structure at a subsequent stage of fabrication.
Figure 24:
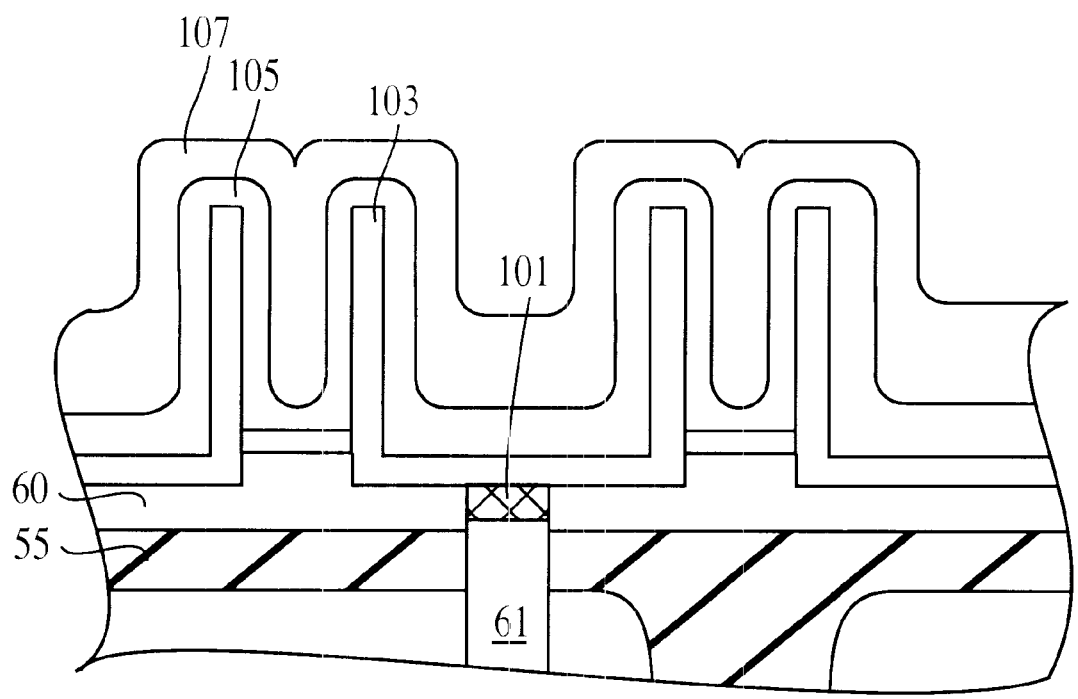
FIG. 24 is a side sectional view of the FIG. 23 structure at a subsequent stage of fabrication.
Figure 25:
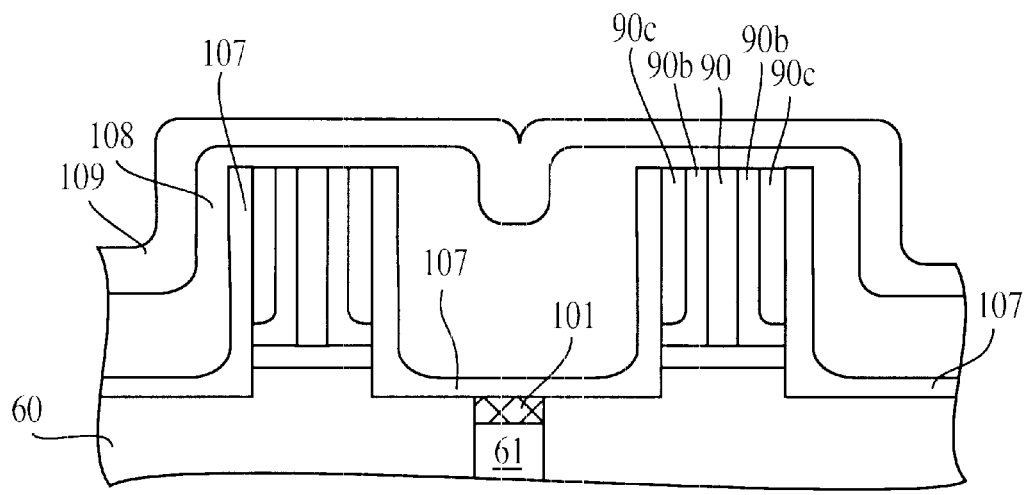
FIG. 25 is a side sectional view of the FIG. 20 structure at a subsequent stage of fabrication.

If the sidewall spacers 90 are titanium nitride spacers, the conductive barrier layer 101 is exposed during the etching steps described above, as shown in FIG. 21. Thereafter, with reference to FIGS. 22 and 23, a layer of platinum 103 is deposited over the titanium nitride sidewall spacers 90 (or 90 and 90a). Platinum cell nodes are then electrically isolated by filling with resist, and the top surfaces of spacers 90 (or 90 and 90a) are exposed by dry etching, or CMP, to remove the portion of the platinum layer 103 covering the spacers. Then, the spacers 90 (or 90 and 90a) are removed as described above. The resist covering the platinum cell nodes is also subsequently removed. The MIM capacitor is formed, with reference to FIG. 24, by depositing a dielectric layer 105 having a high dielectric constant, such as $Ta_2O_5$ or BST, over layer 103. Then a platinum cell plate 107 is deposited over dielectric layer 105. The platinum material in layers 103 and 107 may be substituted with other suitable materials, for example, ruthinium oxide, rhodium, or platinum rhodium.

Where the sidewall spacers 90 are not titanium nitride spacers, such as polysilicon sidewall spacers described above, the MIM capacitors are formed as follows. With reference to FIGS. 15, 16, and 17, a sidewall spacer made of platinum is deposited as sidewall spacer 90, instead of a polysilicon spacer. Then, a $Ta_2O_5$ or barium strontium titanate (BST) dielectric, or another high dielectric constant dielectric, is deposited as layer 90b. A platinum layer is deposited as layer 90c. These layers are then spacer etched and then over etched through barrier layer 164 down to the tops of conductive barrier 101. The MIM capacitor structure is then completed as follows. With reference to FIG. 25, a platinum cell node layer 107 is deposited, and the cell nodes are filled with resist. Thereafter, the platinum cell node layer 107 is etched back to electrically isolate each cell capacitor, exposing the tops of spacers 90, 90b, and 90c, and the resist is removed from the cell nodes.

The cell node layer 107 is electrically isolated from spacers 90 and neighboring cell nodes, as shown in FIG. 25. A $Ta_2O_5$ cell dielectric layer 108 is then deposited over cell nodes 107 and exposed spacers 90, 90b, and 90c. A platinum cell plate 109 is deposited over the dielectric layer 108.

In subsequent processing steps, cell plate 109 can be electrically connected to the spacer(s) 90. This can be accomplished, for example, by forming contact holes through layers 108 and 109 to the spacer(s) 90 using a reactive ion etching process, as described above. The contact holes could then be filled with a conductive material to electrically connect the spacer(s) 90 to the cell plate 109. The aforementioned connections can be made at the edges of memory arrays, thereby making spacer(s) 90 part of the cell plate of the capacitor.

Figure 26:
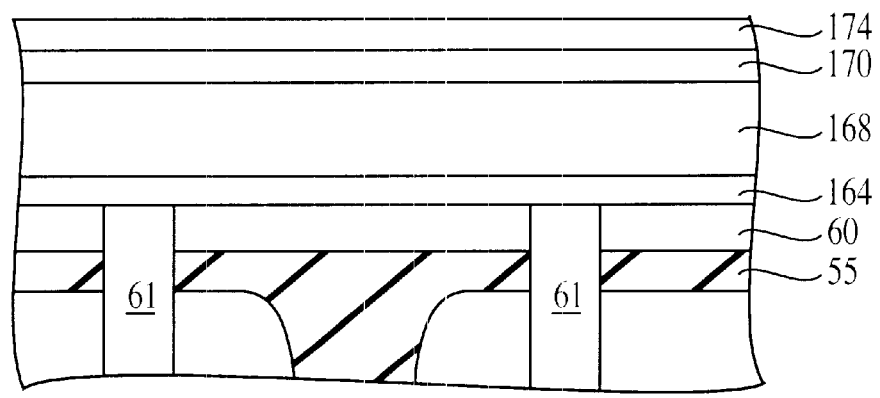
FIG. 26 is a diagrammatic sectional view of a semiconductor wafer fragment illustrating a base structure for forming another embodiment of the invention.

In another embodiment of the present invention, the square or rectangular block honeycomb sidewall pattern can be achieved by silicide patterning. With reference to FIG. 26, a structure is formed according to methods well known in the art, and as discussed above, having a digit line 55, and cell node plugs 61, having contacts rising above the digit line 55, in a layer 60, which may be BPSG. A conductive barrier layer 101, as shown FIG. 20, may be formed if so required by the resulting capacitor structure. A layer 164 consisting of nitride is deposited over layer 60. A thick layer 168 of phosphosilicate glass (PSG) or BPSG is deposited over layer 164. On top of layer 168 is deposited a layer 170 of polysilicon, and a layer 174 of TEOS.

Figure 27:
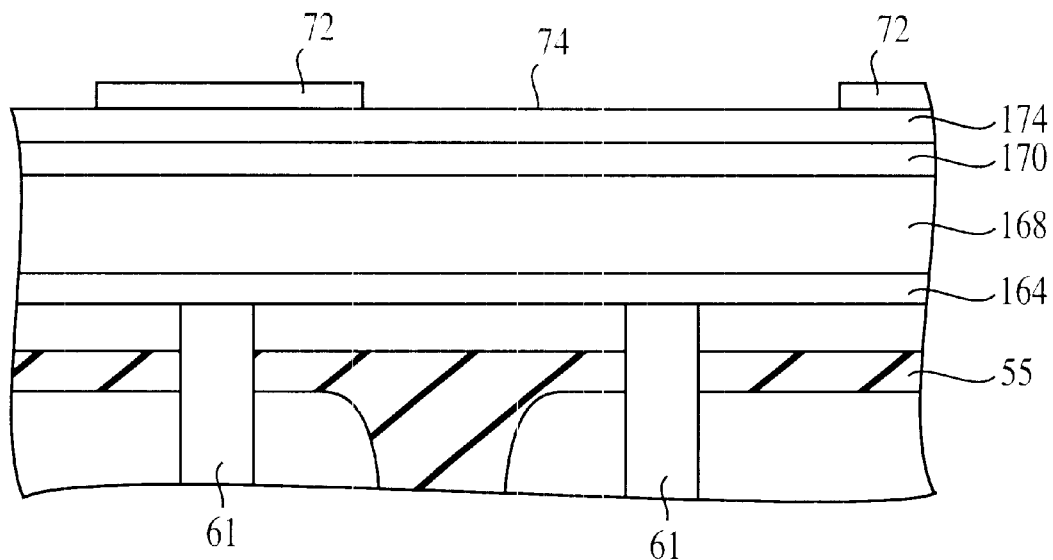
FIG. 27 is a side sectional view of the FIG. 26 structure at a subsequent stage of fabrication.
Figure 28:
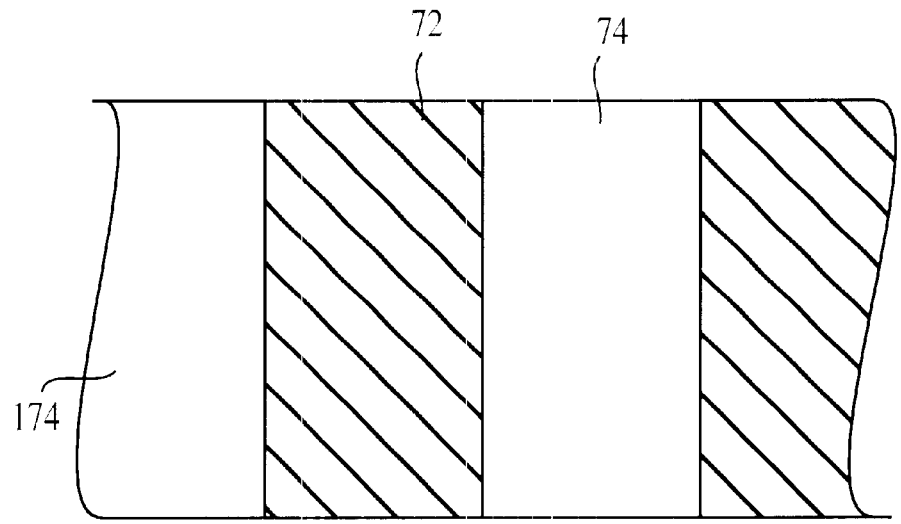
FIG. 28 is top view of FIG. 27.
Figure 29:
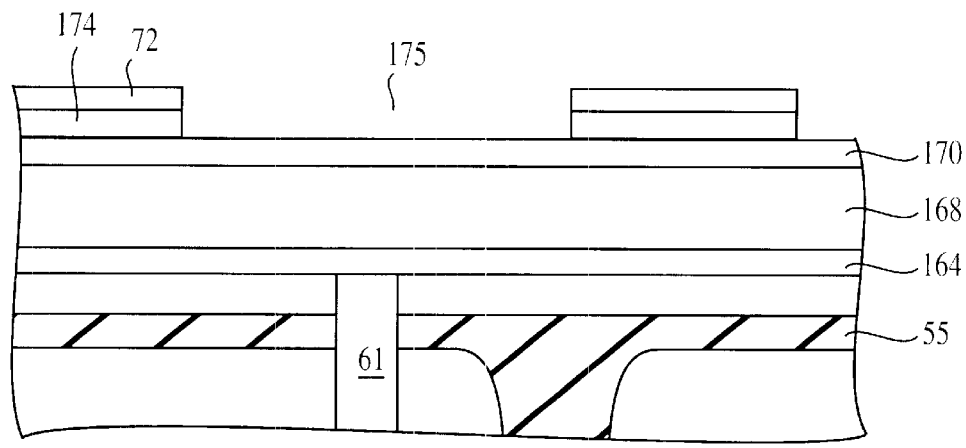
FIG. 29 is a side sectional view of the FIG. 27 structure at a subsequent stage of fabrication.
Figure 30:
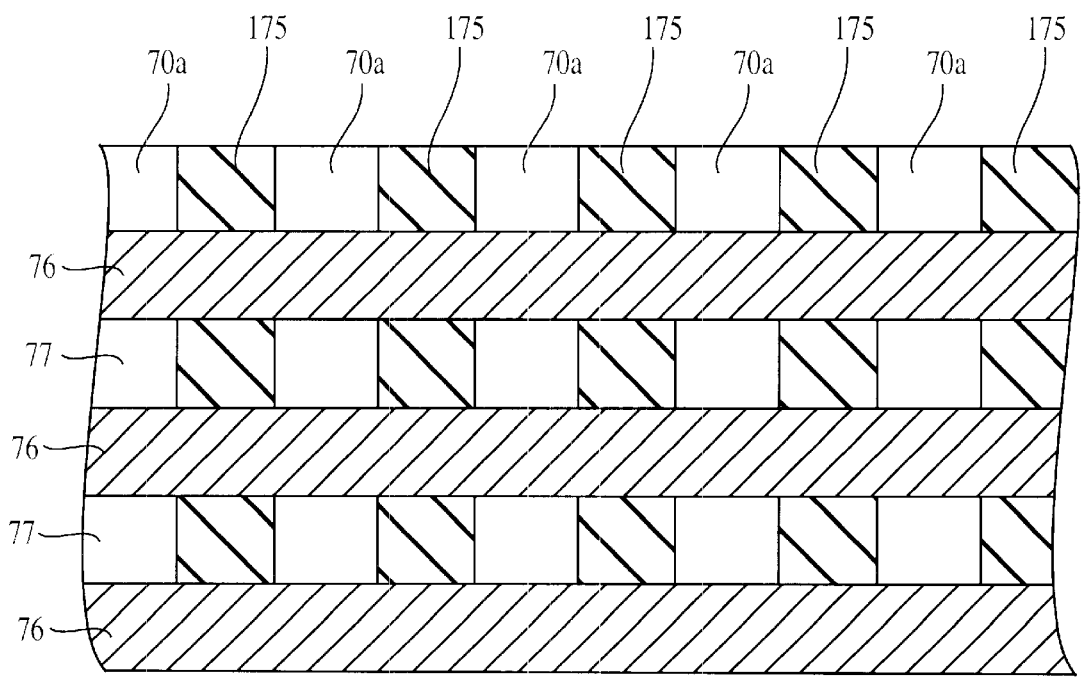
FIG. 30 is top view of the FIG. 29 structure at a subsequent stage of fabrication.
Figure 31:
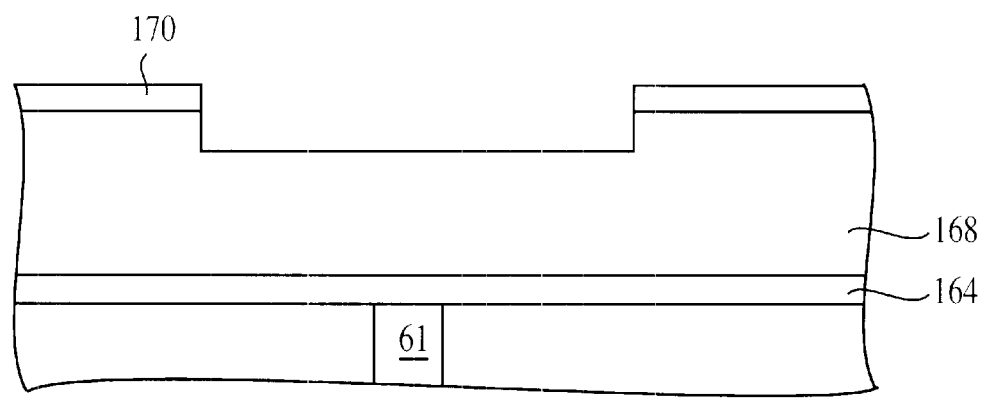
FIG. 31 is a side sectional view of the FIG. 29 structure at a subsequent stage of fabrication.

A layer of patterned photoresist 72 is formed over the TEOS layer 174, as shown in FIGS. 27 and 28, to define a first series of trenches 74. With reference to FIG. 29, the patterned photoresist 72 is used to etch trenches 175 in the TEOS layer 174. The trenches 175 are etched over every other row of the cell node polysilicon plugs 61, and the etching is down to and stops at the polysilicon layer 170. The photoresist 72 is subsequently removed. As shown in FIG. 30, another layer of patterned photoresist 76 is deposited to define a second series of trenches 77 that are perpendicular to the trenches 175 etched into the TEOS layer 174. Reference numeral 70a represents rows of the TEOS layer, between the photoresist 76, that have not been etched (covered by photoresist 72 in the prior etching step). The second series of photoresist rows run over every other line of cell node polysilicon plugs 61. The second series of photoresist trenches are used to etch trenches in polysilicon layer 170 in a two step etch. The first step etch is a selective anisotropic etch through the exposed polysilicon layer 170. Then, a selective oxide etch is performed to remove the TEOS layer 174 from the polysilicon layer 170. This etch is performed down into the BPSG or PSG layer 168. Therefore, subsequent to etching the second row of trenches, remaining portions of the TEOS layer 174 are removed from the top the polysilicon layer 170 by an oxide etch or another suitable method, as seen in FIG. 31.

Figure 32:
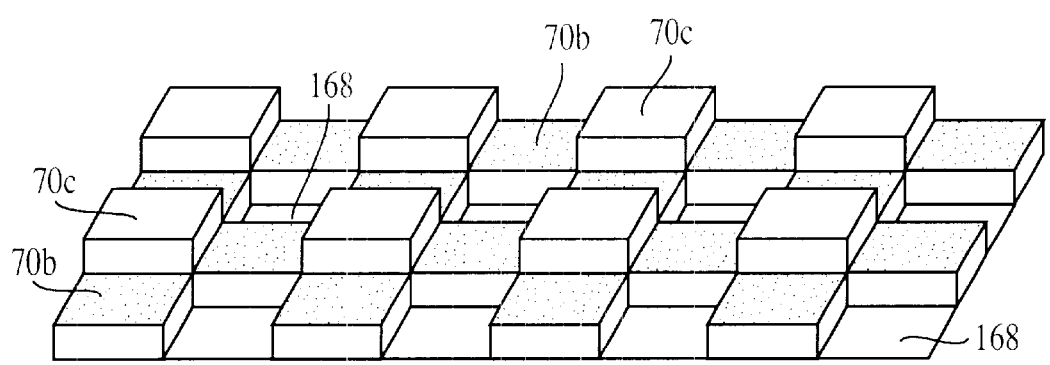
FIG. 32 is a perspective view of the FIG. 31 structure.

The effect of etching the two transverse series of trenches is illustrated in FIG. 32, and forms a block checker board pattern. The resulting structure is comprised of an array of trenches, or an alternating square, rectangular, or oval checker pattern having higher elevations of TEOS layer areas 70c, and intermediate elevations of polysilicon 70b. FIG. 32 also shows the underlying layer of BPSG 168. The alternating square or rectangular checker pattern is comprised of three different elevations due to the two separate etching steps: some portions have been etched twice (down to the BPSG layer 168), some portions once, forming areas 70b, and other portions not etched at all, forming areas 70c. Alternatively, the aforementioned techniques can be used to form alternating oval structures (not shown). The above steps used to form the alternating block pattern are discussed in detail in U.S. Pat. No. 6,087,263, the disclosure of which is incorporated herein by reference.

Figure 33:
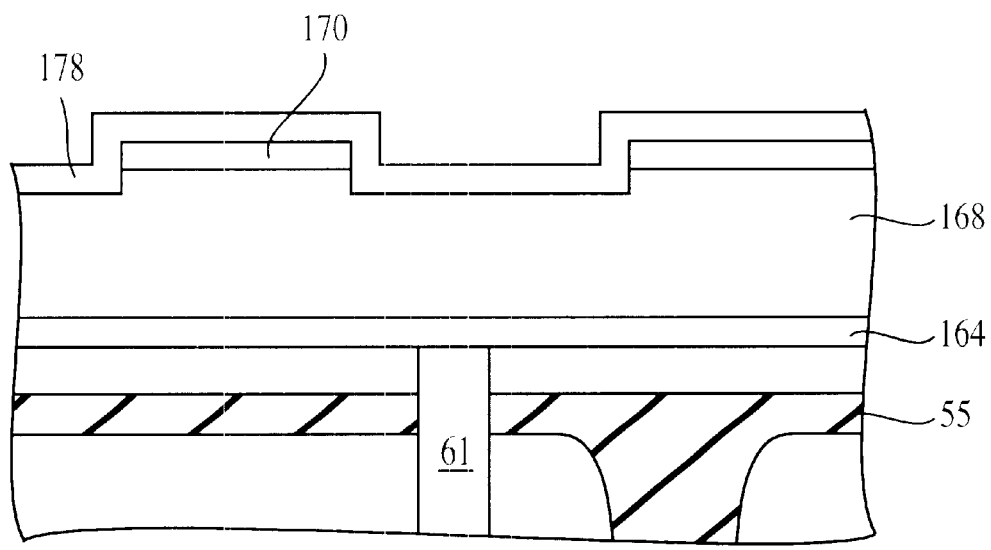
FIG. 33 is a side sectional view of the FIG. 31 structure at a subsequent stage of fabrication.

Referring now to FIG. 33, a metal layer 178 is deposited over the top surface of the block pattern. The metal deposited should be one that easily forms a silicide. An exemplary material for metal layer 178 would be titanium, paladium, or tungsten. A silicide is then formed by annealing the metal layer 178 with the polysilicon layer 170 where the two layers are in direct contact.

Figure 34:
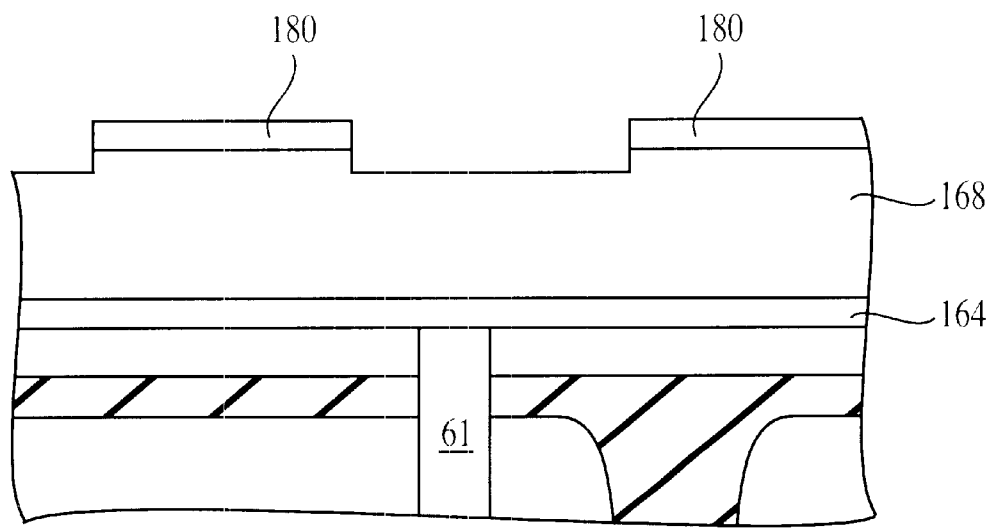
FIG. 34 is a side sectional view of the FIG. 33 structure at a subsequent stage of fabrication.
Figure 35:
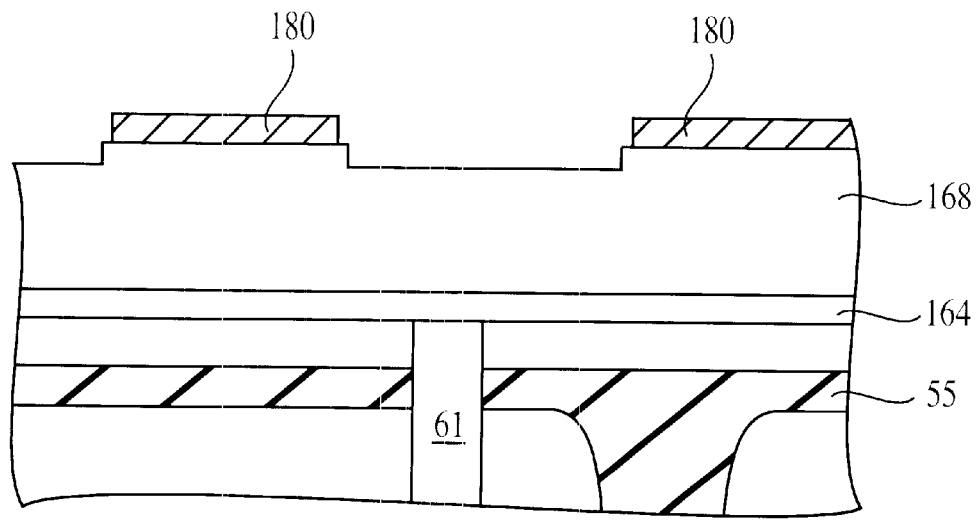
FIG. 35 is a side sectional view of the FIG. 34 structure at a subsequent stage of fabrication.

Next, with reference to FIG. 34, a wet etch is used to remove the portions of the metal layer 178 that did not react with the polysilicon layer 170 to form a metal silicide during the annealing step. The remaining metal portion is the silicide metal layer 180. Any remaining TEOS and polysilicon are subsequently etched away, using any appropriate etching process, thereby leaving behind a silicide block pattern (checker board pattern). The silicide blocks 180 are then isotropically etched back so that the silicide blocks do not bridge together at the corners, as illustrated in FIGS. 35 and 36.

Figure 36:
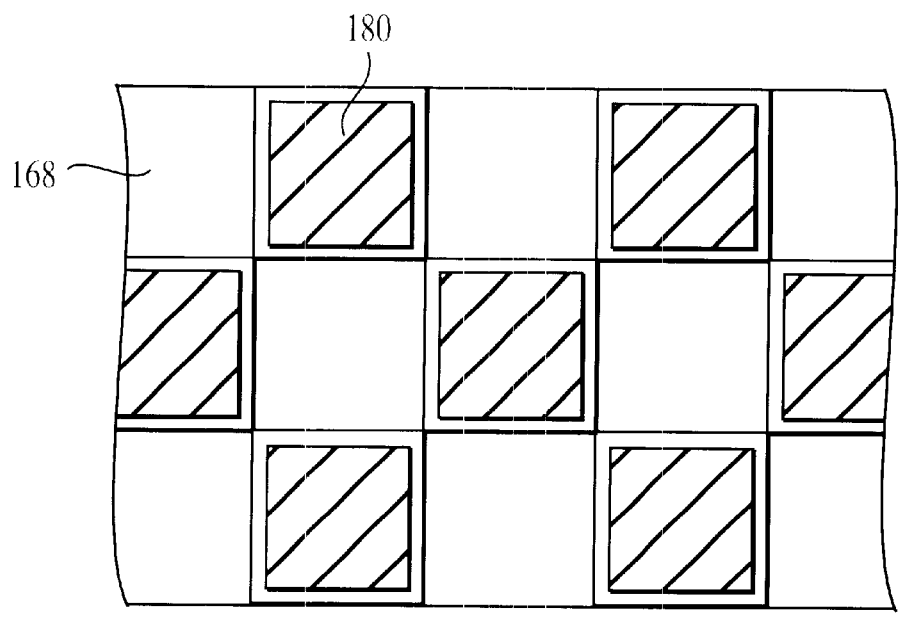
FIG. 36 is a top view of the FIG. 35 structure.
Figure 37:
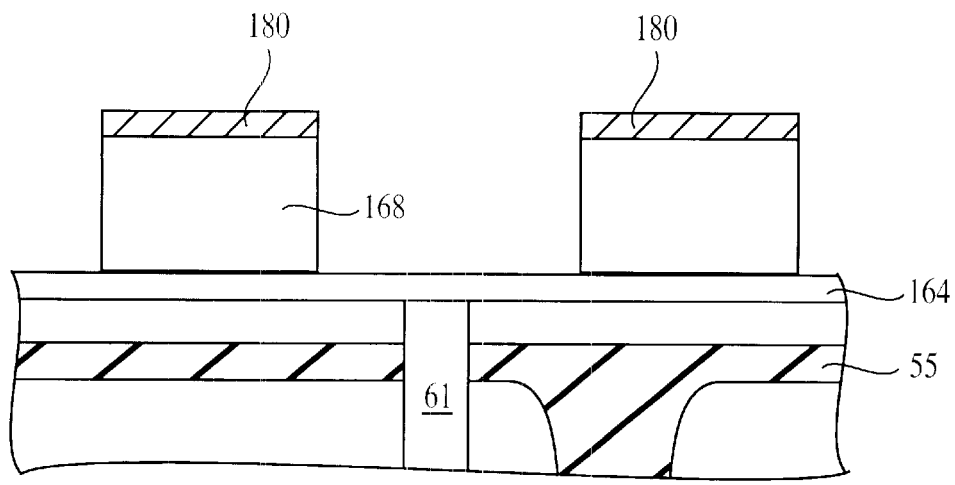
FIG. 37 is a side sectional view of the FIG. 35 structure at a subsequent stage of fabrication.

Using the silicide 180 checkerboard block pattern, as illustrated in FIG. 36, as a mask, the BPSG or PSG layer 168 is then selectively and anisotropically etched down to layer 164 consisting of nitride, or another suitable dielectric etch stop layer, as shown in FIG. 37. Thereafter, the silicide blocks 180 are removed either by an etching step or by a chemical-mechanical polish (CMP), leaving BPSG square or rectangular blocks 168 over layer 164.

Figure 38:
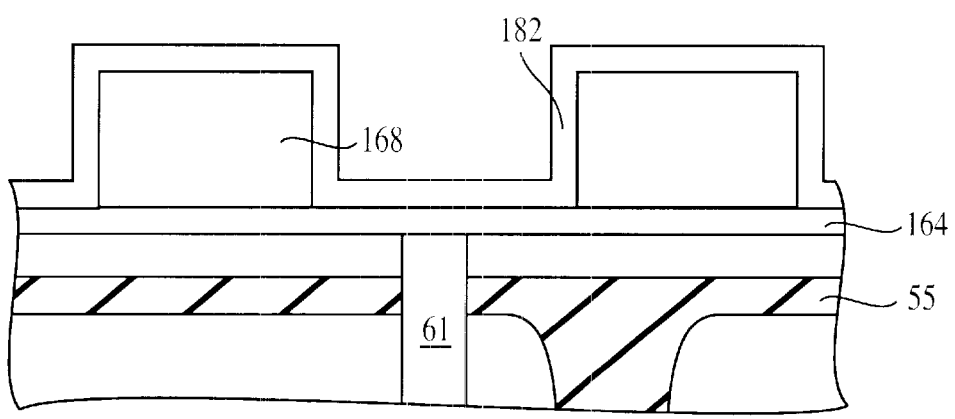
FIG. 38 is a side sectional view of the FIG. 37 structure at a subsequent stage of fabrication.
Figure 39:
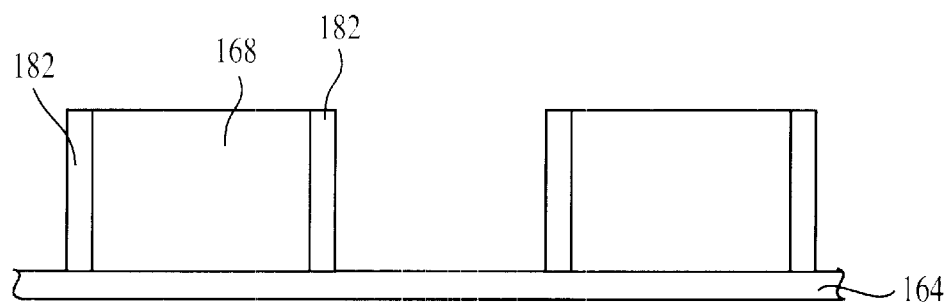
FIG. 39 is a side sectional view of the FIG. 38 structure at a subsequent stage of fabrication.

Next, with reference to FIG. 38, a spacer material 182 is deposited over the blocks 168. The spacer material 182 could be TEOS, amorphous silicon, polysilicon, titanium nitride, or another material. The spacer material 182 will be chosen by the artisan depending upon the type of capacitor that will be eventually made in the capacitor containers defined by the spacer material 182. When choosing spacer material 182, consideration must be given to ensure that the spacer material 182 is etchably different from the block material 168, thereby enabling subsequent removal of the block material 168 without damaging the spacer material 182. The spacer material is then spacer etched to create sidewall spacers, as illustrated in FIG. 39.

Figure 40:
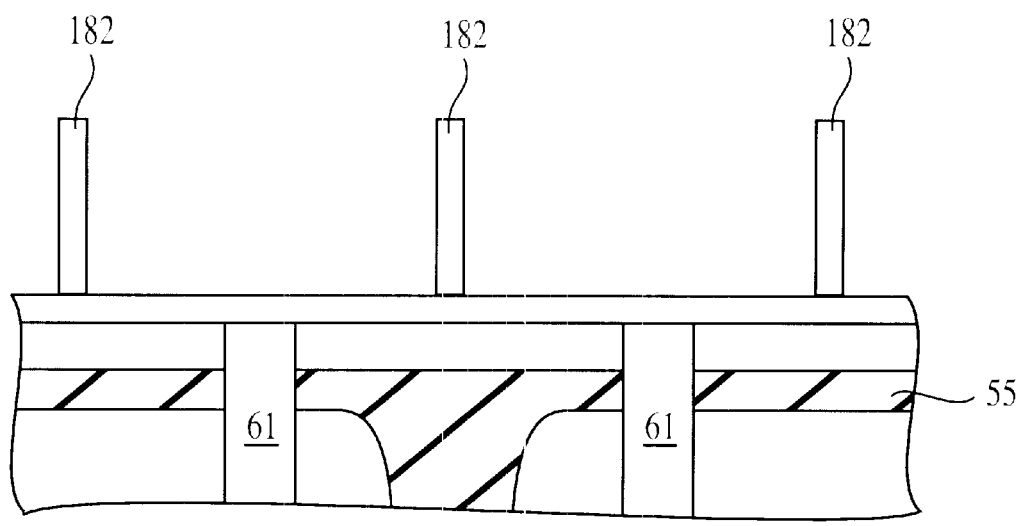
FIG. 40 is a side sectional view of the FIG. 39 structure at a subsequent stage of fabrication.
Figure 41:
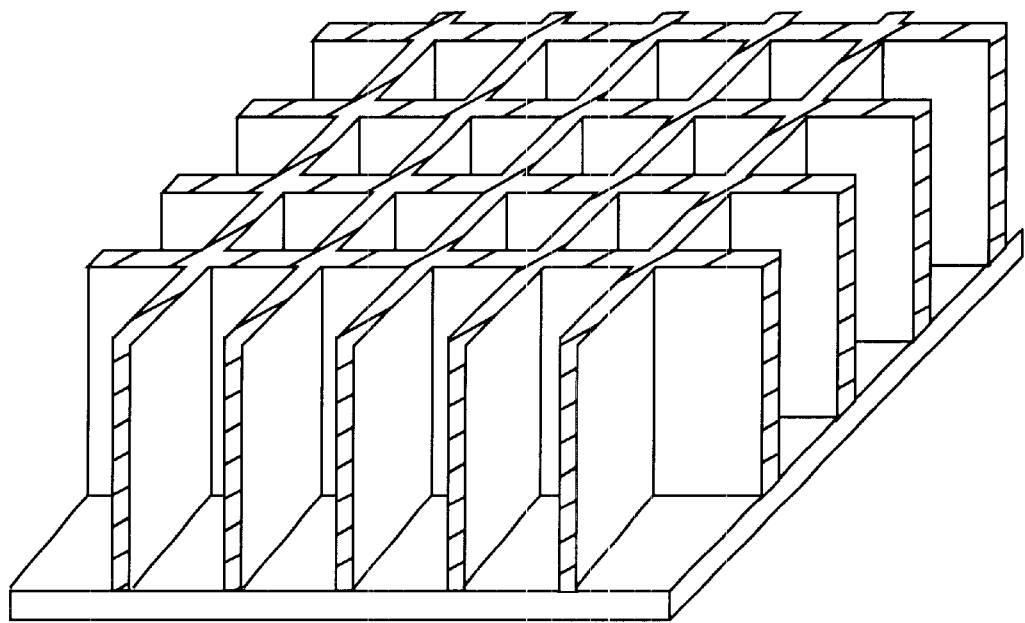
FIG. 41 is a perspective view of the FIG. 40 structure.

The BPSG or PSG blocks 168 are then removed by an etching process, or other suitable process, leaving a grid of interlocked spacers 182, as illustrated in FIGS. 40 and 41. The spacers 182 are then covered with layers of materials depending upon the material chosen for the spacers, i.e. titanium nitride or polysilicon, as disclosed above. If the spacer 182 is a amorphous silicon spacer, a process of seeding and annealing the spacer can be performed to form a selective HSG layer, prior to the deposition of the cell nitride layer. The HSG layer will provide the benefit of a greater surface area, resulting in greater capacitance.

Thereafter, various types of capacitors can be formed in the containers, defined by the interlocked spacers 182, over the buried digit line 55. For example, Hemispherical Grain (HSG) Polysilicon can be deposited to form the bottom cell plate of the capacitor, followed by a dielectric layer such as a nitride, an then depositing an upper electrode. As disclosed above, MIS or MIM capacitor structures may also be formed.

Figure 42:
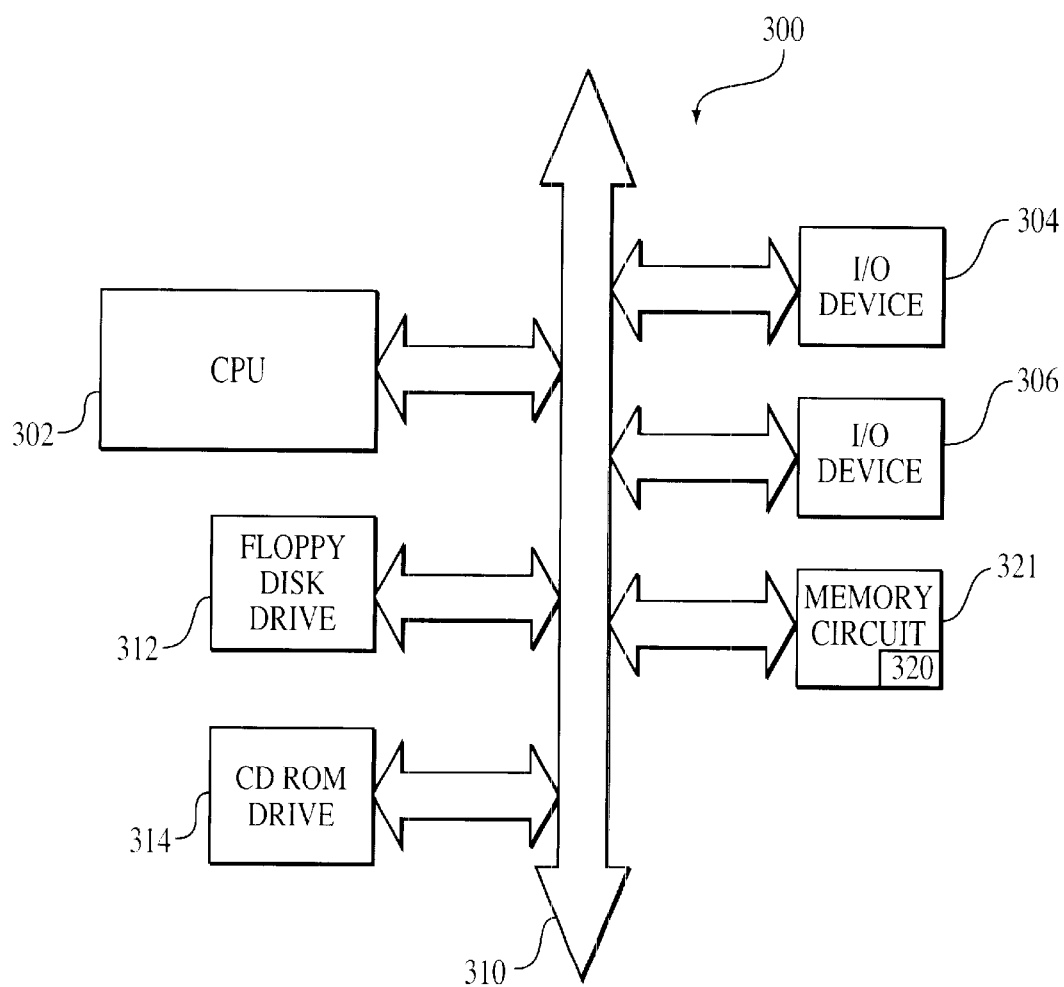
FIG. 42 is a diagram of a computer system according to an embodiment of the present invention.

FIG. 42 illustrates a computer system 300 that may incorporate the benefits of the present invention. The system 300 has a memory circuit 321 including a capacitor array 320 constructed in accordance with the present invention. The system 300 includes a central processing unit (CPU) 302 for performing computer functions, such as executing software to perform desired tasks and calculations. One or more input/output devices 304, 306, such as a keypad or a mouse, are coupled to the CPU 302 and allow an operator to manually input data thereto or to display or otherwise output data generated by the CPU 302. One or more peripheral devices such as a floppy disk drive 312 or a CD ROM drive 314 may also be coupled to the CPU 302. The computer system 300 also includes a bus 310 that couples the input/output devices 312, 314 and the memory circuit 321 to the CPU 302.

While exemplary embodiments of the invention have been described and illustrated, it should be apparent that many modifications can be made to the present inventions without departing from its spirit and scope. For example, the above described checker board pattern could be printed on BPSG, PSG, or another layer, utilizing photoresist patterning, or other patterning techniques. Accordingly the invention is not limited by the foregoing description or drawings, but is only limited by the scope of the appended claims.

What is claimed as new and desired to be protected by Letters Patent of the United States is:

1. A method of forming a semiconductor memory structure comprising:
    forming a capacitor support structure over a digit line and over a substrate, said support structure including interconnected sidewalls defining containers between said sidewalls, at least some of said containers being formed over respective capacitor plugs; and
    forming capacitors in at least some of said containers.
2. The method according to claim 1 wherein said capacitor plugs extend to a transistor region formed in said substrate.
3. The method according to claim 1 wherein said support structure comprises a single layer of material.
4. The method according to claim 1 wherein said support structure comprises a plurality of layers of material.
5. The method according to claim 1 further comprising forming said support structure by etching at least one layer of the support structure forming material to form one of rectangular, oval, and square alternating block pattern.
6. The method according to claim 5 further comprising forming sidewall spacers on vertical surfaces of said block pattern.
7. The method according to claim 5 further comprising transferring said block pattern into an underlying layer of said support structure forming material.
8. The method according to claim 7 further comprising forming sidewall spacers on sidewalls of said transferred block pattern.
9. The method according to claim 8 further comprising forming said capacitor support structure from said sidewall spacers.
10. The method according to claim 5 further comprising forming a metal layer on top of said alternating block pattern.
11. The method according to claim 10 wherein said metal layer consists of one of titanium, palladium, and tungsten.
12. The method according to claim 10 further comprising annealing said metal layer to form a suicide.
13. The method according to claim 5 wherein said support structure forming material comprises a BPSG layer between a nitride layer and a polysilicon layer.
14. The method according to claim 5 wherein said support structure forming material comprises a nitride layer beneath a BPSG layer, a polysilicon layer over said BPSG layer, and a TEOS layer over said polysilicon layer.
15. The method according to claim 5 wherein said support structure forming material comprises a nitride layer beneath a PSG layer, a polysilicon layer over said PSG layer, and a TEOS layer over said polysilicon layer.
16. The method according to claim 8 wherein said sidewall spacers comprise polysilicon spacers.
17. The method according to claim 8 wherein said sidewall spacers comprise titanium nitride spacers.
18. The method according to claim 8 wherein said sidewall spacers comprise TEOS spacers that are etched from between the capacitors.
19. The method according to claim 8 wherein said sidewall spacers comprise platinum spacers.
20. The method according to claim 8 wherein said sidewall spacers comprise amorphous silicon spacers.
21. The method according to claim 20 further comprising seeding and annealing said spacers to form an HSG layer.
22. The method according to claim 1 wherein said capacitors are formed as metal insulator metal capacitors.
23. The method according to claim 22 wherein said capacitors comprise a first platinum layer, a $Ta_2O_5$ or BST layer, and a second platinum layer.

24. The method according to claim 23 further comprising forming a conductive barrier layer beneath either the first or second platinum layer.

25. The method according to claim 24 wherein said conductive barrier layer comprises tantalum nitride or tantalum silicon nitride.

26. The method according to claim 1 wherein said capacitors are formed as metal insulator silicon capacitors.

27. The method according to claim 26 wherein said capacitors comprise an HSG layer, a $Ta_2O_5$ layer, and a titanium nitride layer.

28. The method according to claim 8 wherein said spacers are electrically connected to a cell plate and function as part of the cell plate of the capacitor.

29. A method of forming a capacitor array comprising:
   forming a digit line over a substrate; providing electrical contacts extending above said digit line; forming a pattern of interconnected sidewalls over said electrical contacts; and forming capacitors electrically connected to said electrical contacts in containers defined by said sidewalls.

30. The method according to claim 29 wherein said electrical contacts extend to a transistor region formed in said substrate.

31. The method according to claim 29 further comprising forming said interconnected sidewalls in a support structure.

32. The method according to claim 31 wherein said support structure comprises a single layer of material.

33. The method according to claim 31 wherein said support structure comprises a plurality of layers of material.

34. The method according to claim 31 further comprising forming an alternating block pattern in at least one layer of material in said support structure.

35. The method according to claim 34 further comprising forming sidewall spacers on vertical surfaces of said block pattern.

36. The method according to claim 34 further comprising transferring said block pattern into an underlying layer of said support structure.

37. The method according to claim 36 further comprising forming sidewall spacers on said transferred block pattern.

38. The method according to claim 37 further comprising forming said interconnected sidewalls from said sidewall spacers.

39. The method according to claim 34 further comprising forming a metal layer on top of said alternating block pattern.

40. The method according to claim 39 wherein said metal layer consists of one of titanium, palladium, and tungsten.

41. The method according to claim 33 further comprising annealing said metal layer to form a suicide.

42. The method according to claim 33 wherein said plurality of layers comprises a BPSG layer between a nitride layer and a polysilicon layer.

43. The method according to claim 33 wherein said plurality of layers comprises a nitride layer beneath a BPSG layer, a polysilicon layer over said BPSG layer, and a TEOS layer over said polysilicon layer.

44. The method according to claim 33 wherein said plurality of layers comprises a nitride layer beneath a PSG layer, a polysilicon layer over said PSG layer, and a TEOS layer over said polysilicon layer.

45. The method according to claim 37 wherein said sidewall spacers comprise polysilicon spacers.

46. The method according to claim 37 wherein said sidewall spacers comprise titanium nitride spacers.

47. The method according to claim 37 wherein said sidewall spacers comprise TEOS spacers that are etched from between the capacitors.

48. The method according to claim 37 wherein said sidewall spacers comprise platinum spacers.

49. The method according to claim 37 wherein said sidewall spacers comprise amorphous silicon spacers.

50. The method according to claim 43 further comprising seeding and annealing said spacers to form an HSG layer.

51. The method according to claim 29 wherein said capacitors are formed as metal insulator metal capacitors.

52. The method according to claim 51 wherein said capacitors comprise a first platinum layer, a $Ta_2O_5$ or BST layer, and a second platinum layer.

53. The method according to claim 52 further comprising forming a conductive barrier layer beneath either the first or second platinum layer.

54. The method according to claim 53 wherein said conductive barrier layer comprises tantalum nitride or tantalum silicon nitride.

55. The method according to claim 29 wherein said capacitors are formed as metal insulator silicon capacitors.

56. The method according to claim 55 wherein said capacitors comprise an HSG layer, a $Ta_2O_5$ layer, and a titanium nitride layer.

57. The method according to claim 37 wherein said spacers are electrically connected to a cell plate and function as part of the cell plate of the capacitor.

58. The method according to claim 6 wherein said sidewall spacers comprise TEOS spacers and are left between said capacitors.

59. The method according to claim 37 wherein said sidewall spacers comprise TEOS spacers and are left between said capacitors.

* * * * *

UNITED STATES PATENT AND TRADEMARK OFFICE
CERTIFICATE OF CORRECTION

PATENT NO. : 6,686,235 B2
DATED : February 3, 2004
INVENTOR(S) : Darwin A. Clampitt It is certified that error appears in the above-identified patent and that said Letters Patent is hereby corrected as shown below:

<u>Column 11,</u>
Line 51, "suicide" should be changed to -- silicide --

Signed and Sealed this

Twenty-fifth Day of May, 2004

JON W. DUDAS
*Acting Director of the United States Patent and Trademark Office*